US 7,994,031 B2

(12) United States Patent
Horsky et al.

(10) Patent No.: US 7,994,031 B2
(45) Date of Patent: Aug. 9, 2011

(54) METHOD OF MANUFACTURING CMOS DEVICES BY THE IMPLANTATION OF N- AND P-TYPE CLUSTER IONS

(75) Inventors: Thomas Neil Horsky, Boxborough, MA (US); Dale Conrad Jacobson, Hackettstown, NJ (US); Wade Allen Krull, Marblehead, MA (US)

(73) Assignee: Semequip, Inc., North Billerica, MA (US)

( * ) Notice: Subject to any disclaimer, the term of this patent is extended or adjusted under 35 U.S.C. 154(b) by 0 days.

(21) Appl. No.: 11/647,922

(22) Filed: Dec. 29, 2006

(65) Prior Publication Data
US 2007/0105325 A1    May 10, 2007

Related U.S. Application Data

(63) Continuation of application No. 10/251,491, filed on Sep. 20, 2002, which is a continuation-in-part of application No. 10/244,617, filed on Sep. 16, 2002, now Pat. No. 6,744,214.

(60) Provisional application No. 60/391,847, filed on Jun. 26, 2002, provisional application No. 60/392,271, filed on Jun. 26, 2002.

(51) Int. Cl.
H01L 21/425    (2006.01)

(52) U.S. Cl. ........ 438/515; 438/199; 438/301; 438/535; 257/E21.634

(58) Field of Classification Search .................. 438/199, 438/301, 515, 535
See application file for complete search history.

(56) References Cited

U.S. PATENT DOCUMENTS

| 3,908,183 A | | 9/1975 | Ennis, Jr. |
| 3,915,757 A | | 10/1975 | Engel |
| 4,370,176 A | * | 1/1983 | Bruel ........................ 438/514 |
| 4,902,572 A | | 2/1990 | Horne et al. |

(Continued)

OTHER PUBLICATIONS

Kishimoto et al., A High Current Negative-Ion Implanter and its Application for Nanocrystal Frabrication in Insulators, IEEE Proceedings on the 12$^{th}$ Intl. Conference, 1999, pp. 342-345.

(Continued)

*Primary Examiner* — Alexander G Ghyka
(74) *Attorney, Agent, or Firm* — John S. Paniaguas; Katten Muchin Rosenman LLP

(57) ABSTRACT

A method of manufacturing a semiconductor device is further described, comprising the steps of providing a supply of dopant atoms or molecules into an ionization chamber, combining the dopant atoms or molecules into clusters containing a plurality of dopant atoms, ionizing the dopant clusters into dopant cluster ions, extracting and accelerating the dopant cluster ions with an electric field, selecting the desired cluster ion by mass analysis, modifying the final implant energy of the cluster ion through post-analysis ion optics, and implanting the dopant cluster ions into a semiconductor substrate. In general, dopant clusters contain n dopant atoms where n can be 2, 3, 4 or any integer number. This method provides the advantages of increasing the dopant dose rate to n times the implantation current with an equivalent per dopant atom energy of 1/n times the cluster implantation energy. This is an effective method for making shallow transistor junctions, where it is desired to implant with a low energy per dopant atom.

42 Claims, 21 Drawing Sheets

U.S. PATENT DOCUMENTS

| | | | |
|---|---|---|---|
| 4,904,902 | A | 2/1990 | Tamai et al. |
| 5,293,508 | A | 3/1994 | Shiratake et al. |
| 5,296,713 | A | 3/1994 | Tanaka |
| 5,433,791 | A * | 7/1995 | Brewer et al. .................. 118/724 |
| 5,561,072 | A * | 10/1996 | Saito ............................. 438/513 |
| 5,683,515 | A | 11/1997 | Nakajima et al. |
| 6,093,594 | A * | 7/2000 | Yeap et al. .................... 438/231 |
| 6,218,672 | B1 | 4/2001 | Alig |
| 6,452,338 | B1 | 9/2002 | Horsky |
| 6,495,474 | B1 | 12/2002 | Rafferty et al. |
| 6,686,595 | B2 | 2/2004 | Horsky |
| 2002/0162508 | A1* | 11/2002 | Dykstra .................. 118/723 CB |
| 2004/0002202 | A1 | 1/2004 | Horsky |

OTHER PUBLICATIONS

Ishikawa et al., "Negative-ion implantation technique", Nuclear Instruments and Methods in Physics Research B 96, 1995, pp. 7-12.

Jacobson et al., "Decaborane, an Alternative Approach to Ultra Low Energy Ion Implantation", IEEE Proceedings, 2000, pp. 300-303.

Yamada et al., "Applications of Gas Cluster Ion Beams for Materials Processing", Materials Science and Engineering A217/218, 2996, pp. 82-88, 1996.

Takeuchi et al., "Shallow Junction Formation by Polyatomic Cluster Ion Implantation", Proc. of the 11$^{th}$ Intl. Conference on Ion Implantation Technology, 1997, pp. 772-775.

* cited by examiner

Diagram of the Cluster Ion Source

Diagram of Cluster Ion Implementation System

EXAMPLE OF CMOS FABRICATION SEQUENCE A) NMOS DRAIN EXTENSION B) PMUS DRAIN EXTENSION

METHOD OF MANUFACTURING CMOS DEVICES BY THE IMPLANTATION OF N- AND P-TYPE CLUSTER IONS

CROSS-REFERENCE TO RELATED APPLICATIONS

This patent application is a continuation of commonly owned copending U.S. patent application Ser. No. 10/251,491, filed on Sep. 20, 2002, which is a continuation-in-part of commonly owned U.S. patent application Ser. No. 10/244,617, filed on Sep. 16, 2002, now U.S. Pat. No. 6,744,214. This patent application also claims priority of commonly owned copending U.S. provisional patent application Ser. No. 60/391,847, filed on Jun. 26, 2002; and commonly owned copending U.S. provisional patent application Ser. No. 60/392,271, filed on Jun. 26, 2002.

The following patent applications, herein incorporated by reference, are also related to the present application: PCT Application, Ser. No. PCT/US00/33786, filed Dec. 13, 2000, entitled "Ion Implantation Ion Source, System and Method"; PCT Application Ser. No. PCT/US01/18822, filed Jun. 12, 2001, entitled "Ion Implantation with High Brightness, Low Emittance Ion Source, Acceleration-Deceleration Transport System and Improved Ion Source Construction"; and PCT Application Ser. No. PCT/US02/03258, filed Feb. 5, 2002, entitled, "Ion Source for Ion Implantation"; U.S. patent application, Ser. No. 10/183,768, filed Jun. 26, 2002, entitled "Electron Impact Ion Source".

BACKGROUND OF THE INVENTION

1. Field of the Invention

The present invention relates to an ion implantation system and a method of semiconductor manufacturing which implants ion beams formed from clusters of the N-type dopant cluster ions, such as $As_4H_x^+$ and P-type dopant cluster ions, such as $B_{10}H_x^-$.

2. Description of the Prior Art

The fabrication of semiconductor devices involves, in part, the introduction of impurities into the semiconductor substrate to form doped regions. The impurity elements are selected to bond appropriately with the semiconductor material to create an electrical carrier and change the electrical conductivity of the semiconductor material. The electrical carrier can either be an electron (generated by N-type dopants) or a hole (generated by P-type dopants). The concentration of introduced dopant impurities determines the electrical conductivity of the resultant region. Many such N- and P-type impurity regions must be created to form transistor structures, isolation structures and other such electronic structures, which collectively function as a semiconductor device.

The conventional method of introducing dopants into a semiconductor substrate is by ion implantation. In ion implantation, a feed material containing the desired element is introduced into an ion source and energy is introduced to ionize the feed material, creating ions which contain the dopant element (for example, the elements $^{75}As$, $^{11}B$, $^{115}In$, $^{31}P$, or $^{121}Sb$. An accelerating electric field is provided to extract and accelerate the typically positively-charged ions, thus creating an ion beam. Then, mass analysis is used to select the species to be implanted, as is known in the art, and the ion beam is directed at a semiconductor substrate. The accelerating electric field gives the ions kinetic energy, which allows the ions to penetrate into the target. The energy and mass of the ions determine their depth of penetration into the target, with higher energy and/or lower mass ions allowing deeper penetration into the target due to their greater velocity. The ion implantation system is constructed to carefully control the critical variables in the implantation process, such as the ion beam energy, ion beam mass, ion beam current (electrical charge per unit time), and ion dose at the target (total number of ions per unit area that penetrate into the target). Further, beam angular divergence (the variation in the angles at which the ions strike the substrate) and beam spatial uniformity and extent must also be controlled in order to preserve semiconductor device yields.

It has recently been recognized, for example, by Kishimoto et al., "A High-Current Negative-Ion Implanter and its Application for Nanocrystal Fabrication in Insulators", IEEE Proceedings of the XII$^{th}$ International Conference on Ion Implantation Technology, Kyoto, Japan, pp. 342-345 (1999), and Ishikawa et al., "Negative-Ion Implantation Technique", Nuclear Instruments and Methods in Physics Research B 96, pp. 7-12 (1995), and others in the field that implanting negative ions offers advantages over implanting positive ions. One very important advantage of negative ion implantation is to reduce the ion implantation-induced surface charging of modern processor and memory devices during the manufacturing process. In general, the implantation of high currents (on the order of 1 mA or greater) of positive ions creates a positive potential on the gate oxides and other components of the semiconductor device which can easily exceed gate oxide damage thresholds. When a positive ion impacts the surface of a semiconductor device, it not only deposits a net positive charge, but liberates secondary electrons at the same time, multiplying the charging effect. Thus, equipment vendors of ion implantation systems have developed sophisticated charge control devices, so-called electron flood guns, to introduce low-energy electrons into the positively-charged ion beam and onto the surface of the device wafers during the implantation process. Such electron flood systems introduce additional variables into the manufacturing process, and cannot completely eliminate yield losses due to surface charging. As semiconductor devices become smaller and smaller, transistor operating voltages and gate oxide thicknesses become smaller as well, reducing the damage thresholds in semiconductor device manufacturing, further reducing yield. Hence, negative ion implantation potentially offers a substantial improvement in yield over conventional positive ion implantation for many leading-edge processes. Unfortunately, this technology is not yet commercially available, and indeed negative ion implantation has not to the author's knowledge been used to fabricate integrated circuits, even in research and development.

Prior art negative ion sources have relied upon so-called negative affinity sputter targets. A heavy inert gas, such as xenon, is fed into a plasma source which creates $Xe^+$ ions. Once produced, the $Xe^+$ ions are drawn to a negatively-biased sputter target which has been coated with cesium vapor or other suitable alkaline material. The energetic $Xe^+$ ions sputter away the neutral target atoms, some of which pick up an electron while leaving the target surface due to the negative electron affinity of the cesium coating. Once negatively charged, the target ions are repelled from the target and can be collected from the ion source by electrostatic ion optics and focused into a negative ion beam. While it is possible to produce semiconductor dopant ions such as boron by this method, the ion currents tend to be low, the beam emittance tends to be large, and the presence of cesium vapor presents a nearly unacceptable risk to wafer yield, since alkaline metals are considered very serious contaminants to silicon processing. Hence, a more commercially viable negative ion source technology is needed.

Of particular interest in semiconductor manufacturing process is the formation of p-n junctions within the semiconductor substrate. This requires the formation of adjacent regions of n-type and p-type doping. One general example of the formation of a junction is the implantation of n-type dopant into a semiconductor region already containing a uniform distribution of p-type dopant. In such a case, an important parameter is the junction depth, which is defined as the depth from the semiconductor surface at which the n-type and p-type dopants have equal concentrations. This junction depth is dependent primarily on the implanted dopant mass, energy and dose.

An important aspect of modern semiconductor technology is the continuous evolution to smaller and faster devices. This process is called scaling. Scaling is driven by the continuous development of improvements to the lithographic process, allowing the definition of smaller and smaller features in the semiconductor substrate containing the integrated circuit. A generally accepted scaling theory has been developed to guide chip manufacturers in the appropriate resize of all aspects of the semiconductor device design at the same time, i.e., at each technology or scaling node. The greatest impact of scaling on ion implantation process is the scaling of junction depths, which requires increasingly shallow junctions as the device dimensions are decreased. The requirement for increasingly shallow junctions as integrated circuit technology scales translates into the following requirement: ion implantation energies must be reduced with each scaling step. Recently, the ion energy required for many critical implants has decreased to the point that conventional ion implantation systems, which were originally developed to generate much higher energy beams, are not effective at providing the necessary implant. These extremely shallow junctions are termed "Ultra-Shallow Junctions" or USJ.

The limitations of conventional ion implantation systems at low beam energy are most evident in the extraction of ions from the ion source, and their subsequent transport through the implanter's beam line. Ion extraction is governed by the Child-Langmuir relation which states that the extracted beam current density is proportional to the extraction voltage (i.e., beam energy at extraction) raised to the 3/2 power. FIG. 1 is a graph of maximum extracted arsenic beam current versus extraction voltage. For simplicity, an assumption has been made that only $^{75}As^+$ ions are present in the extracted beam. FIG. 1 shows that as the energy is reduced, extraction current drops quickly. In a conventional ion implanter this regime of "extraction-limited" operation is seen at energies less than about 10 keV. Similar constraints occur in transporting the low-energy beam. A lower energy ion beam travels with lower velocity, and hence for a given value of beam current the ions are closer together, i.e., the ion density increases. This can be seen from the relation J=nev, where J is the ion beam current density in $mA/cm^2$, n is the ion density in $cm^{-3}$, e is the electronic charge (=$6.02 \times 10^{-19}$ Coulombs), and v is the average ion velocity in cm/s. Since the electrostatic force between ions is inversely proportional to the square of the distance between them, this mutually repulsive force is much stronger at low energy, and thus disperses the ion beam. This phenomenon is called "beam blow-up". While low-energy electrons present in the implanter's beam line tend to be trapped by the positively-charged ion beam and help compensate for space-charge blow-up during transport, nevertheless blow-up still occurs, and most pronounced in the presence of electrostatic focusing lenses, which tend to strip away the loosely-bound, highly mobile compensating electrons from the beam. Low-energy beam transport can be difficult for massive atoms such as arsenic (75 amu), since at a given ion energy, the ion velocity is lower than for lighter atoms. Severe extraction and transport difficulties also exist for the p-type dopant, boron. Boron transport is made difficult by the extremely low implantation energies (e.g., less than 1 keV) required by certain leading edge processes, and the fact that most of the ions extracted and transported from a typical $BF_3$ source plasma are not the desired ion $^{11}B^+$, but rather ion fragments, such as $^{19}F^+$ and $^{49}BF_2^+$, which serve to increase the charge density and average mass of the extracted ion beam. Looking to the future of VLSI semiconductor manufacturing, these difficulties in transporting significant currents of low-energy As and B combine to make the formation of USJ very challenging.

One way to benefit from the Child-Langmuir equation discussed above is to increase the mass of the ion, for example, as illustrated in FIG. 1a, by ionizing a molecule containing the dopant of interest, rather than a dopant atom. In this way, while the kinetic energy of the molecule is higher during transport, upon entering the substrate, the molecule breaks up into its constituent atoms, sharing the energy of the molecule among the individual atoms according to their distribution in mass, so that the dopant atom's implantation energy is much lower than its original transport kinetic energy. Consider a dopant atom "X" bound to a radical "Y" (disregarding for argument's sake the question of whether "Y" affects the device-forming process). If the ion $XY^+$ were implanted in lieu of $X^+$, then $XY^+$ must be extracted and transported at a higher energy, increased by a factor equal to the {(mass of XY)/(mass of X)}; this ensures that the velocity of X remains unchanged. Since the space-charge effects described by the Child-Langmuir equation discussed above are superlinear with respect to ion energy, the maximum transportable ion current is increased. Historically, the use of polyatomic molecules to address the problems of low energy implantation is known in the art. A common example has been the use of the $BF_2^+$ molecular ion for the implantation of low-energy boron, in lieu of $B^+$. This process dissociates $BF_3$ feed gas to the $BF_2^+$ ion for implantation. In this way, the ion mass is increased to 49 AMU, allowing an increase of the extraction and transport energy by almost a factor of 5 (i.e., 49/11) over using single boron atoms. Upon implantation, however, the boron energy is reduced by the same factor of (49/11). We note that this approach does not reduce the current density in the beam, since there is only one boron atom per unit charge in the beam. In addition, this process also implants fluorine atoms into the semiconductor substrate along with the boron, however fluorine has been known to exhibit adverse effects on the semiconductor device.

There has also been molecular ion work using decaborane as a polyatomic molecule, for ion implantation, as reported by Jacobson et al., "Decaborane, an alternative approach to ultra low energy ion implantation", IEEE Proceedings of the XIII$^{th}$ International Conference on Ion Implantation Technology, Alpsbach, Austria, pp. 300-303 (2000), and by Yamada, "Applications of gas cluster ion beams for materials processing", Materials Science and Engineering A217/218, pp. 82-88 (1996). In this case, the implanted particle was an ion of the decaborane molecule, $B_{10}H_{14}$, which contains 10 boron atoms, and is therefore a "cluster" of boron atoms. This technique not only increases the mass of the ion, but for a given ion current, it substantially increases the implanted dose rate, since the decaborane ion $B_{10}H_x^+$ has ten boron atoms per unit charge. This is a very promising technology for the formation of USJ p-type metal-oxide-semiconductor (PMOS) transistors in silicon, and in general for implanting very low-energy boron. Significantly reducing the electrical current carried in the ion beam (by a factor of 10 in the case of decaborane ions), not only reduces beam space-charge effects, but wafer charging effects as well. Since charging of the wafer, particularly the gate oxides, by positive ion beam bombardment, is know to reduce device yields by damaging sensitive gate isolation, such a reduction in electrical current through the use of cluster ion beams is very attractive for USJ device manufacturing, which must increasingly accomodate exceedingly low gate threshold voltages. It is to be noted that in these two examples of P-type molecular implantation, the ions are created by simple ionization of the feed material rather than by the conglomeration of feed material into clusters. It is also to be noted that there has not, until now, been a comparable technology developed for producing n-type molecular dopant ions. The future success of complementary metal-oxide-semiconductor (CMOS) processing may well depend on the commercialization of viable N- and P-type polyatomic implantation technologies. Thus there is a need to solve two distinct problems facing the semiconductor manufacturing industry today: wafer charging, and low productivity in low-energy ion implantation.

Ion implanters have historically been segmented into three fundamental types: high current, medium current, and high energy implanters. Cluster beams are useful for high current and medium-current implantation processes. More particularly, today's high current implanters are primarily used to form the low-energy, high dose regions of the transistor such as drain structures and doping of the polysilicon gates. They are typically batch implanters, i.e., processing many wafers mounted on a spinning disk, while the ion beam remains stationary. High current beam lines tend to be simple and incorporate a large acceptance of the ion beam; at low energy and high currents, the beam at the substrate tends to be large, with a large angular divergence. Medium-current implanters typically incorporate a serial (one wafer at a time) process chamber, which offers a high tilt capability (e.g., up to 60 degrees from substrate normal). The ion beam is typically electromagnetically scanned across the wafer in an orthogonal direction, to ensure dose uniformity. In order to meet commercial implant dose uniformity and repeatability requirements of typically only a few percent variance, the ion beam should have excellent angular and spatial uniformity (angular uniformity of beam on wafer of <2 deg, for example). Because of these requirements, medium-current beam lines are engineered to give superior beam control at the expense of limited acceptance. That is, the transmission efficiency of the ions through the implanter is limited by the emittance of the ion beam. Presently, the generation of higher current (about 1 mA) ion beams at low (<10 keV) energy is problematic in serial implanters, such that wafer throughput is unacceptably low for certain lower-energy implants (for example, in the creation of source and drain structures in leading-edge CMOS processes). Similar transport problems also exist for batch implanters (processing many wafers mounted on a spinning disk) at the low beam energies of <5 keV per ion.

While it is possible to design beam transport optics which are nearly aberration-free, the ion beam characteristics (spatial extent, spatial uniformity, angular divergence and angular uniformity) are nonetheless largely determined by the emittance properties of the ion source itself (i.e., the beam properties at ion extraction which determine the extent to which the implanter optics can focus and control the beam as emitted from the ion source). The use of cluster beams instead of monomer beams can significantly enhance the emittance of an ion beam by raising the beam transport energy and reducing the electrical current carried by the beam. Thus, there is a need for cluster ion and cluster ion source technology in semiconductor manufacturing to provide a better-focused, more collimated and more tightly controlled ion beam on target, in addition to providing higher effective dose rates and higher throughputs.

SUMMARY OF THE INVENTION

An object of this invention is to provide a method of manufacturing a semiconductor device this method being capable of forming ultra-shallow impurity-doped regions of n-type (i.e. acceptor) conductivity in a semiconductor substrate, and furthermore to do so with high productivity.

Another object of this invention is to provide a method of manufacturing a semiconductor device, this method being capable of forming ultra-shallow impurity-doped regions of either N- or P-type (i.e., acceptor or donor) through the use of N- and P-type clusters of the form $As_nH_x^+$, where n=3 or 4 and $0 \leq x \leq n+2$ for the N-type cluster, and either $B_{10}H_x^+$ or $B_{10}H_x^-$ for the P-type cluster.

A further object of this invention is to provide a method of implanting arsenic cluster ions of the form $As_3H_x^+$ and $As_4H_x^+$, the method being capable of forming ultra-shallow implanted regions of n conductivity type in a semiconductor substrate.

A further object of this invention is to provide a method of making phosphorus cluster ions of the form $P_nH_x^+$, where n equals 2, 3, or 4 and x is in the range $0 \leq x \leq 6$ by ionizing $PH_3$ feed gas, and subsequently implanting said phosphorus cluster into a semiconductor substrate to accomplish N-type doping.

A further object of this invention is to provide a method of making boron cluster ions of the form $B_nH_x^+$, where n equals 2, 3, or 4 and x is in the range $0 \leq x \leq 6$ by ionizing $B_2H_6$ feed gas, and subsequently implanting said boron cluster into a semiconductor substrate to accomplish P-type doping.

A still further object of this invention is to provide for an ion implantation system for manufacturing semiconductor devices, which has been designed to form ultra shallow impurity doped regions of either N or P conductivity type in a semiconductor substrate through the use of cluster ions.

According to one aspect of this invention, there is provided a method of implanting cluster ions comprising the steps of: providing a supply of dopant atoms or molecules into an ionization chamber, combining the dopant atoms or molecules into clusters containing a plurality of dopant atoms and ionizing the dopant clusters into dopant cluster ions, extracting and accelerating the dopant cluster ions with an electric field, mass analyzing the ion beam, and implanting the dopant cluster ions into a semiconductor substrate.

An object of this invention is to provide a method that allows the semiconductor device manufacturer to ameliorate the difficulties in extracting low energy ion beams by implanting a cluster of n dopant atoms (n=4 in the case of $As_4H_x^+$) rather than implanting a single atom at a time. The cluster ion implant approach provides the equivalent of a low energy, monatomic implant since each atom of the cluster is implanted with an energy of E/n. Thus, the implanter is operated at an extraction voltage n times higher than the required implant energy, which enables higher ion beam current, particularly at the low implantation energies required by USJ formation. Considering the ion extraction stage, the relative improvement enabled by cluster ion implant can be quantified by evaluating the Child-Langmuir limit. It is recognized that this limit can be approximated by:

$$J_{max}=1.72(Q/A)^{1/2}V^{3/2}d^{-2}, \quad (1)$$

where $J_{max}$ is in mA/cm$^2$, Q is the ion charge state, A is the ion mass in AMU, V is the extraction voltage in kV, and d is the gap width in cm. FIG. 1 is a graph of Eq. (1) for the case of $^{75}$As$^+$ with d=1.27 cm. In practice, the extraction optics used by many ion implanters can be made to approach this limit. By extension of Eq. (1), the following figure of merit, Δ, can be defined to quantify the increase in throughout, or implanted dose rate, for a cluster ion implant relative to monatomic implantation:

$$\Delta = n(U_n/U_1)^{3/2}(m_n/m_1)^{-1/2}. \quad (2)$$

Here, Δ is the relative improvement in dose rate (atoms/sec) achieved by implanting a cluster with n atoms of the dopant of interest at an energy $U_n$ relative to the single atom implant of an atom of mass $m_i$ at energy $U_i$, where $U_i$=eV. In the case where $U_n$ is adjusted to give the same dopant implantation depth as the monatomic (n=1) case, equation (2) reduces to:

$$\Delta = n^2. \quad (3)$$

Thus, the implantation of a cluster of n dopant atoms has the potential to provide a dose rate n$^2$ higher than the conventional implant of single atoms. In the case of As$_4$H$_x$, for small x, this maximum dose rate improvement is about a factor of sixteen. A comparison between low-energy As and As$_4$ implantation is shown in FIG. 2 to illustrate this point.

The use of clusters for ion implant also addresses the transport of low-energy ion beams. It is to be noted that the cluster ion implant process only requires one electrical charge per cluster, rather than having every dopant atom carrying one electrical charge, as in the conventional case. The transport efficiency (beam transmission) is thus improved, since the dispersive Coulomb forces are reduced with a reduction in charge density. In addition, the clusters have higher mass than their monomers, and are therefore less affected by the intrabeam Coulomb forces. Thus, implanting with clusters of n dopant atoms rather than with single atoms ameliorates basic transport problems in low energy ion implantation and enables a dramatically more productive process.

Enablement of this method requires the formation of said cluster ions. The conventional sources used in commercial ion implanters produce only a very small fraction of primarily lower-order (e.g., n=2) clusters relative to their production of monomers, and hence these implanters cannot effectively realize the low-energy cluster beam implantation advantages listed above. Indeed, the intense plasmas provided by many conventional ion sources rather dissociate molecules and clusters into their component elements. The novel ion source described herein produces cluster ions in abundance due to its use of a "soft" ionization process, namely electron-impact ionization by energetic primary electrons. The ion source of the present invention is designed expressly for the purpose of producing and preserving dopant cluster ions.

DESCRIPTION OF THE DRAWING

These and other advantages of the present invention will be readily understood with reference to the following specification and attached drawing wherein.

DETAILED DESCRIPTION

Figure 1:
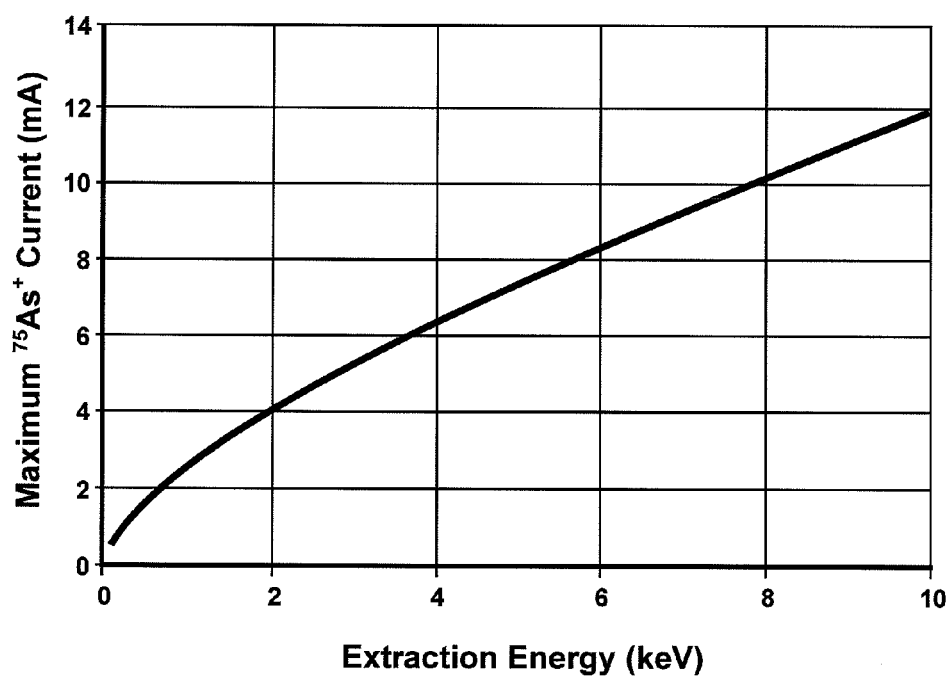
FIG. 1 is a graphical diagram illustrating maximum $^{75}$As$^+$ beam current vs. extraction energy according to the Child-Langmuir Law.
Figure 1A:
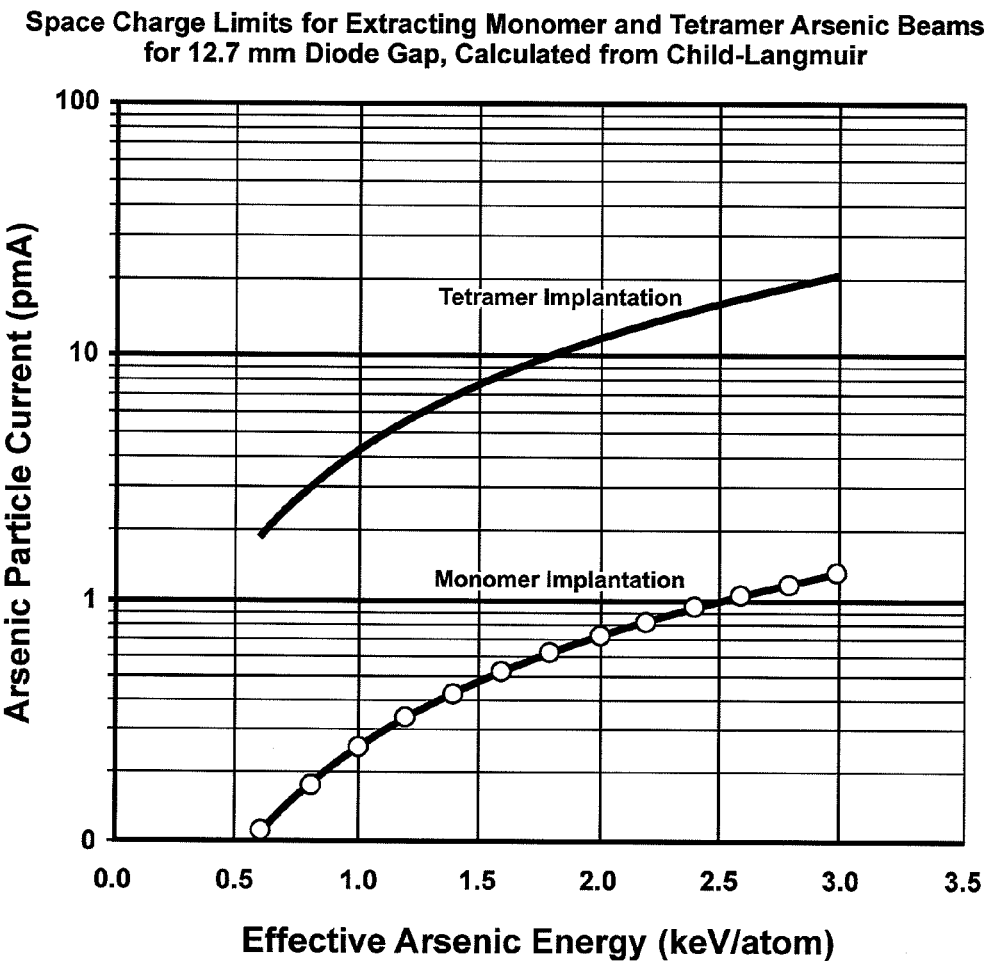
FIG. 1a is a graphical diagram illustrating a comparison of maximum extraction current achievable through tetramer arsenic and monomer arsenic.
Figure 2:
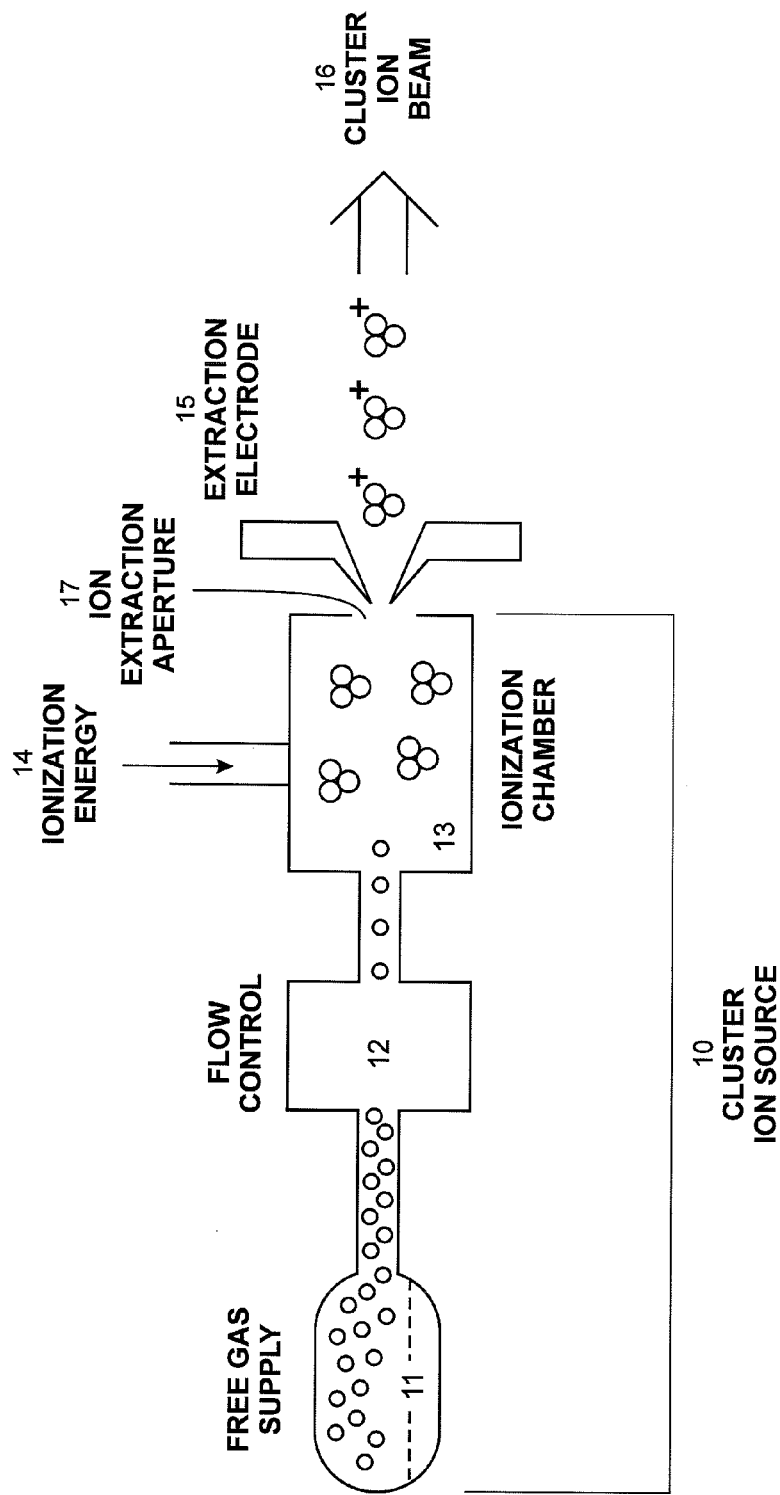
FIG. 2 is a simplified diagram of the cluster ion source in accordance with the present invention.

FIG. 2 is a conceptual diagram of a cluster ion source 10 and its various components. A supply of feed gas 11 is provided, such as a cylinder of AsH$_3$, PH$_3$, B$_2$H$_6$ or vaporized B$_{10}$H$_{14}$. The feed material can be stored in a cylinder as a gas at room temperature, or can be introduced as vapor sublimated from a heated solid or evaporated from a liquid phase. The feed gas supply 11 is connected to an ionization chamber 13 through a flow controller 12. The flow controller 12 can be as sophisticated as a computer-controlled mass flow controller, or as simple as a connecting tube with predetermined gas conductance. In the latter case, the flow is varied by controlling the pressure of the gas in 11. The controlled flow of dopant-containing gaseous feed material creates a stable gas pressure within the ionization chamber 13, for example, between approximately $3 \times 10^{-4}$ Torr and $3 \times 10^{-3}$ Torr. Ionization energy 14 is provided in the form of a controlled current of electrons with a defined energy or velocity. The temperature of ionization chamber 13 and indeed of all the components of the ion source is typically controlled to a desired value. By tuning the source pressure, temperature, electron current, and electron energy, an environment is created within the ionization chamber 13 such that the dopant atoms or molecules of, for example, $AsH_3$, combine to form cluster ions that contain more than one atom of the desired dopant element, for example, the tetramer compound $As_4H_x^+$, where x is an integer between 0 and 4.

An aperture 17 in the ionization chamber 13 allows ions to escape into the beam path, extracted by a strong electric field between ionization chamber 13 and an extraction electrode 15. This extraction, or accelerating, field is generated by a high voltage power supply which biases the ionization chamber 13 to a voltage V relative to ground potential, the extraction electrode 15 being near ground potential. The accelerating field is established in the forward direction to attract positive ions out of the ionization chamber 13, and in the reverse direction when negative ions are desired. The accelerated ions are formed into an ion beam 16 by the extraction electrode 15. The kinetic energy E of ion beam 16 is given by Equation (4):

$$E = |q \, V|, \quad (4)$$

where V is the source potential, and q is the electric charge per ion. When V is expressed in volts and q is expressed in units of electronic charge, E has units of electron-volts (eV).

Figure 2A:
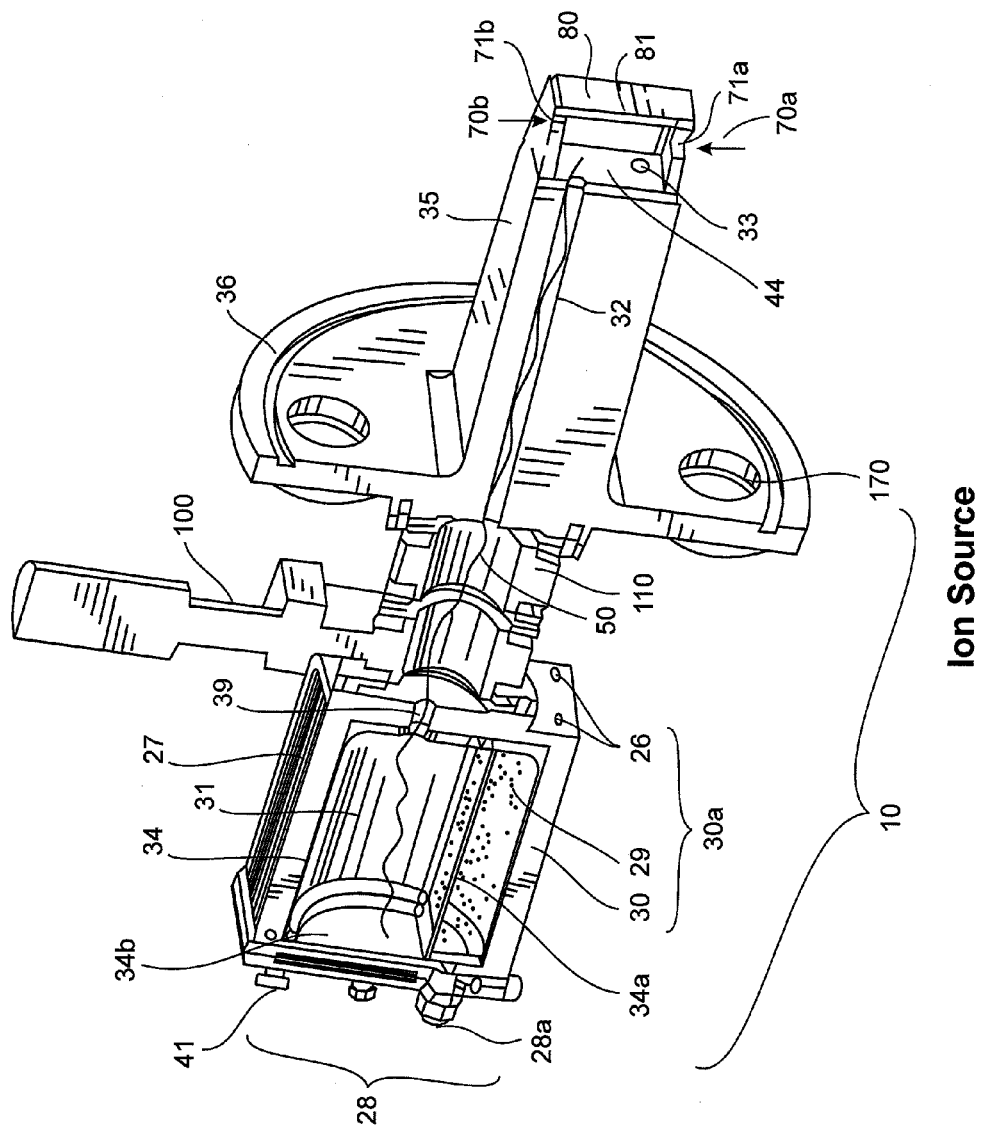
FIG. 2a is a perspective diagram of an exemplary embodiment of the cluster ion source in accordance with the present invention.

The ion source described herein is one embodiment of a novel electron impact ionization source. FIG. 2a is a cross-sectional schematic diagram of the source construction which serves to clarify the functionality of the components which make up the ion source 10. The ion source 10 is made to interface to an evacuated vacuum chamber of an ion implanter or other process tool by way of a mounting flange 36. Thus, the portion of the ion source 10 to the right of flange 36, shown in FIG. 2a, is at high vacuum (pressure<$1 \times 10^{-4}$ Torr). Gaseous material is introduced into the ionization chamber 44 in which the gas molecules are ionized by electron impact from opposed electron beams 70a and 70b, which enter the ionization chamber 44 through entrance apertures 71a and 71b, respectively, such that electron beams 70a and 70b are aligned with ion extraction aperture 81. Thus, ions are created adjacent to the ion extraction aperture 81, which appears as a slot in the ion extraction aperture plate 80. The ions are then extracted and formed into an energetic ion beam by an extraction electrode (not shown) located in front of the ion extraction aperture plate 80.

Gases may be fed into the ionization chamber 44 via a gas conduit 33. Solid feed materials can be vaporized in a vaporizer 28, and the vapor fed into the ionization chamber 44 through a vapor conduit 32. Solid feed material 29, located under a perforated separation barrier 34a, is held at a uniform temperature by temperature control of the vaporizer housing 30. Vapor 50 which accumulates in a ballast volume 31 feeds through conduit 39 and through one or more shutoff valves 100 and 110. The vapor 50 then feeds into the ionization chamber 44 through a vapor conduit 32, located in the source block 35. Thus, both gaseous and solid dopant-bearing materials may be ionized by this ion source.

The method herein described can be considered normal operation of the ion source of the present invention where the only difference from other operational modes is the user's choice of values for the source parameters (feed material, feed gas flow rate, electron ionization energy and current, and source component temperature(s)). In the case illustrated in FIG. 2a, where $AsH_3$ is the feed gas, typical values of these source parameters were: $AsH_3$ flow rate=2.5 sccm, electron ionization energy=1.7 keV, electron current=100 mA, and ionization chamber temperature=200 C. One aspect of the ion source of the present invention is user control of the ionization chamber temperature, as well as the temperature of the source block and valves. The source utilizes a combination of heating and cooling to achieve accurate control of the source temperature. Separate temperature control is provided for vaporizer 28, shutoff valves 100 and 110, source block 35, and ionization chamber 44. External electronic controllers (such as an Omron model E5CK) are used for temperature control. Heating is provided by embedded resistive heaters, whose heating current is controlled by the electronic controller. Cooling is provided by a combination of convective and conductive gas cooling methods, as further described, for example, in commonly owned PCT application US01/18822, and in U.S. application Ser. No. 10/183,768, both herein incorporated by reference.

Figure 3:
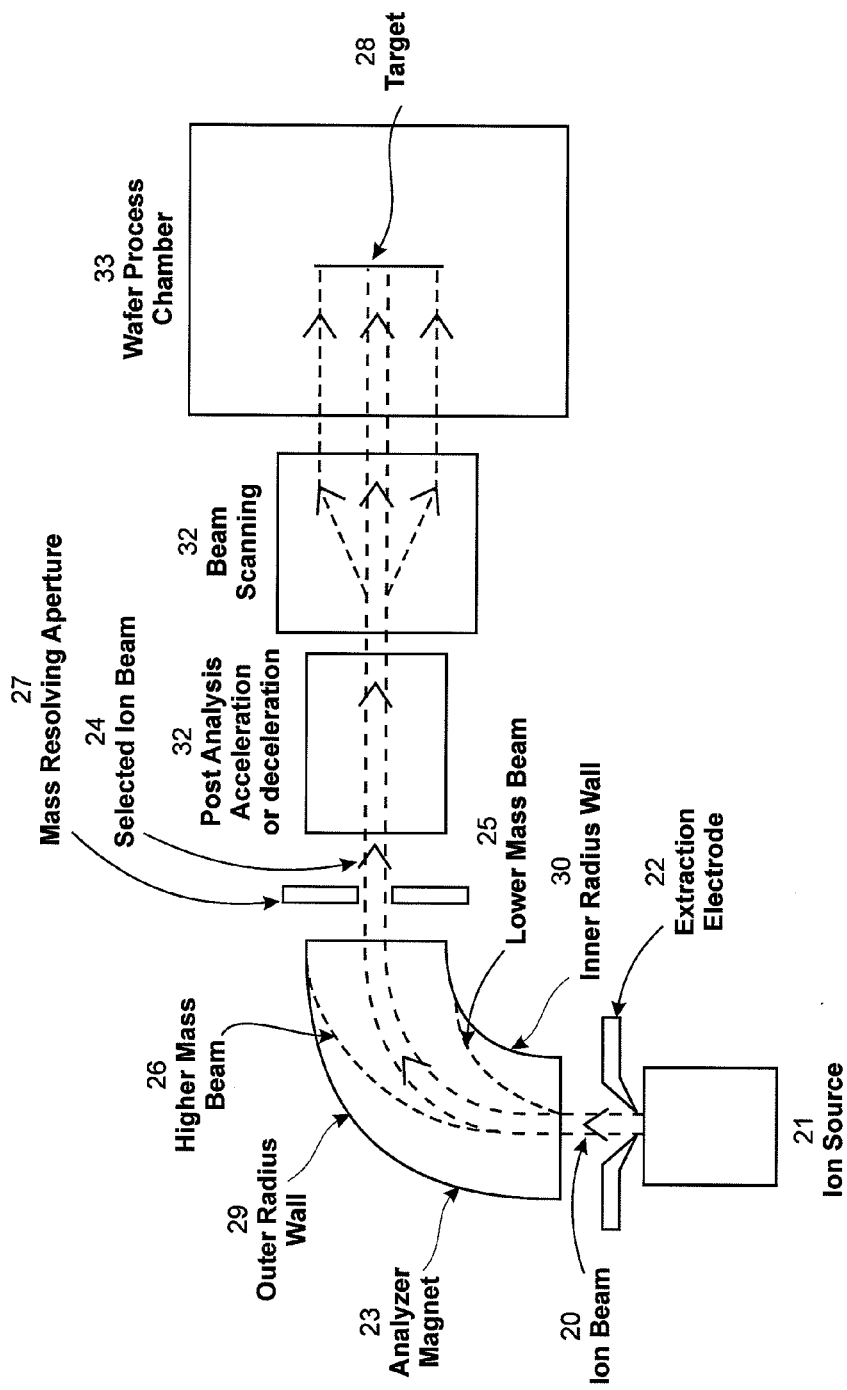
FIG. 3 is a simplified diagram of an exemplary cluster ion implantation system in accordance with the present invention.

FIG. 3 shows the ion source in conjunction with key downstream elements which comprise a proposed cluster ion implantation system. Configurations other than that shown in FIG. 3 are possible. The ion source 21 is coupled with extraction electrode 22 to create an ion beam 20 which contains cluster ions. The ion beam 20 typically contains ions of many different masses, i.e., all of the species for which ions of a given charge polarity are created in the ion source 21. The ion beam 20 then enters the analyzer magnet 23. The analyzer magnet 23 creates a dipole magnetic field within the ion beam transport path depending on the current in the magnet coils; the direction of the magnetic field is normal to the plane of FIG. 3. The function of the analyzer magnet 23 is to spatially separate the ion beam into a set of constituent beamlets by bending the ion beam in an arc whose radius depends on the mass-to-charge ratio of the discrete ions. Such an arc is shown in FIG. 3 as a beam component 24, the selected ion beam. The magnet 23 bends a given beam along a radius given by Equation (5) below:

$$R = (2mU)^{1/2}/qB \quad (5)$$

where R is the bending radius, B is the magnetic flux density, m is the ion mass, U is the ion kinetic energy and q is the ion charge state.

The selected ion beam is comprised of ions of a narrow range of mass-energy product only, such that the bending radius of the ion beam by the magnet sends that beam through a mass-resolving aperture 27. The components of the beam that are not selected do not pass through the mass-resolving aperture 27, but are intercepted elsewhere. For beams with smaller mass-to-charge ratios m/q than the selected beam 25, for example comprised of hydrogen ions having masses of 1 or 2 atomic mass units, the magnetic field induces a smaller bending and the beam intercepts the inner radius wall 30 of the magnet chamber, or elsewhere. For beams with larger mass-to-charge ratios than the selected beam 26, the magnetic field induces a larger bending radius, and the beam strikes the outer radius wall 29 of the magnet chamber, or elsewhere. As is well established in the art, the combination of analyzer magnet 23 and mass-resolving aperture 27 comprise a mass analysis system which selects the ion beam 24 from the multi-species beam 20 extracted from the ion source. The selected beam 24 can then pass through a post-analysis acceleration/deceleration stage 31. This stage 31 can adjust the beam energy to the desired final energy value required for the specific implantation process. The post-analysis acceleration/deceleration stage 31 can take the form of an electrostatic lens, or alternatively a LINAC (linear accelerator), for example. In order to prevent ions which have undergone charge-exchange or neutralization reactions between the resolving aperture and the wafer (and therefore do not possess the correct energy) from propagating to the wafer, a "neutral beam filter" or "energy filter" can be incorporated within this beam path. For example, the post-analysis acceleration/deceleration stage 31 can incorporate a "dogleg" or small-angle deflection in the beam path which the selected ion beam 24 is constrained to follow through an applied DC electromagnetic field; beam components which have become neutral or multiply-charged, however, would necessarily not follow this path. The energy-adjusted beam then enters a beam scanning system 32, in the implantation system depicted in FIG. 3. The beam scanning system 32 scans the beam so that the entire target 28 is uniformly implanted. Various configurations are possible, with one-dimensional or two-dimensional scanning, and electrostatic versus magnetic scanning systems, for example.

The beam then enters the wafer process chamber 33, also held in a high vacuum environment, where it strikes the target 28. Various configurations of wafer processing chambers, and wafer handling systems are possible, the major categories being serial (one wafer at a time) or batch (many wafers processed together on a spinning disk). In a serial process chamber, typically one dimension (either lateral or vertical) is mechanically scanned across the beam, which is electromagnetically scanned in the orthogonal direction, to ensure good spatial uniformity of the implant. In a batch system, spinning of the disk provides mechanical scanning in the radial direction, and either vertical or horizontal scanning of the spinning disk is also effected at the same time, the ion beam remaining stationary.

For cluster ion implantation to provide accurate dopant placement, it is necessary that each of n dopant atoms contained within the cluster penetrate the substrate with the same kinetic energy; in the simplest case in which the molecular ion is of the form $A_n^+$ (that is, it is uniquely comprised of n dopant atoms A), each of the n dopant atoms must receive the same fraction 1/n of the cluster's energy upon penetration into the semiconductor substrate. It has been established, for example by Sze, in *VLSI Technology*, McGraw Hill, pp. 253-254 (1983), that this equal division of energy occurs whenever a polyatomic molecule impacts a solid target surface. Furthermore, it is necessary that the electrical results of such implantation are the same as the equivalent implant using single atom ion implantation. Such results have been shown by Jacobson et al., "Decaborane, an alternative approach to ultra low energy ion implantation", IEEE Proceedings of the XIIIth International Conference on Ion Implantation Technology, Alpsbach, Austria, pp. 300-303 (2000), in detail for the case of implantation with decaborane, and indeed we expect similar results for any dopant cluster.

During ion implantation, dopant atoms may penetrate more deeply into the semiconductor substrate by channeling, i.e., by entering the substrate crystal lattice along a symmetry direction which contains a low density of lattice atoms, or a "channel". If the ion trajectory coincides with the direction of a channel in the semiconductor crystal lattice, the ion substantially avoids collisions with the substrate atoms, extending the range of the dopant projectile. An effective means to limit or even prevent channeling consists of forming an amorphous layer at the surface of the substrate. One means of creating such a layer is to implant the substrate either with ions of the same element(s) of which the substrate consists or with ions having the same electrical properties (i.e., from the same column of the periodic table), such that the crystal damage caused by the implantation process is sufficient to eliminate the crystalline structure of a layer at the substrate surface without subsequently altering the electrical properties of the substrate during the activation step. For example, silicon or germanium ions may be implanted into a silicon substrate at an energy of 20 keV at a dose of $5 \times 10^{14}$ cm$^{-2}$ to form such an amorphous layer in a silicon substrate, followed by the implantation of the shallow dopant layer by cluster ion implantation.

Figure 4:
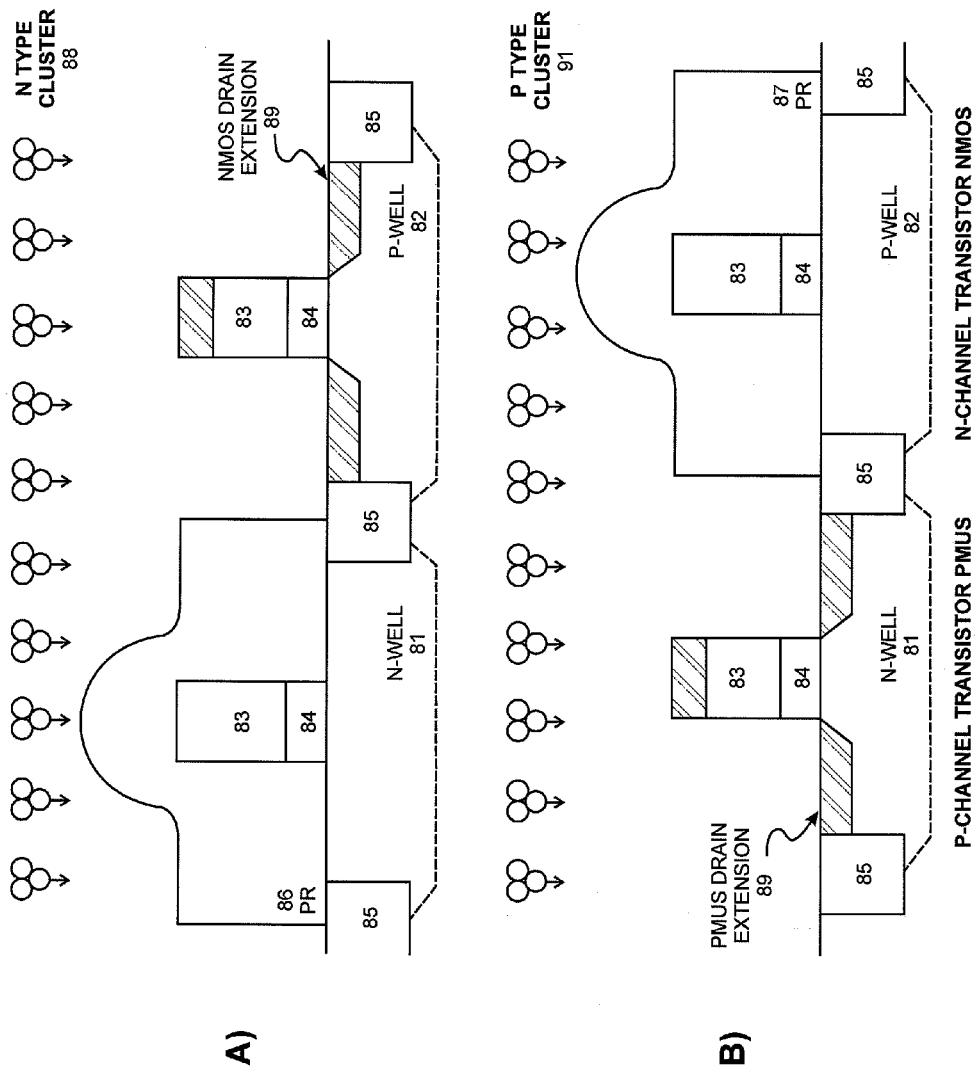
FIG. 4a is a diagram of a CMOS fabrication sequence during formation of the NMOS drain extension.
FIG. 4b is a diagram of a CMOS fabrication sequence during formation of the PMOS drain extension.

An important application of this method is the use of cluster ion implantation for the formation of n- and p-type shallow junctions as part of a CMOS fabrication sequence. CMOS is the dominant digital integrated circuit technology in current use and its name denotes the formation of both n-channel and p-channel MOS transistors (Complementary MOS: both n and p) on the same chip. The success of CMOS is that circuit designers can make use of the complementary nature of the opposite transistors to create a better circuit, specifically one that draws less active power than alternative technologies. It is noted that the n and p terminology is based on negative and positive (n-type semiconductor has negative majority carriers, and vice versa), and the n-channel and p-channel transistors are duplicates of each other with the type (polarity) of each region reversed. The fabrication of both types of transistors on the same substrate requires sequentially implanting an n-type impurity and then a p-type impurity, while protecting the other type of devices with a shielding layer of photoresist. It is noted that each transistor type requires regions of both polarities to operate correctly, but the implants which form the shallow junctions are of the same type as the transistor: n-type shallow implants into n-channel transistors and p-type shallow implants into p-channel transistors. An example of this process is shown in FIGS. 4a and 4b. In particular, FIG. 4a illustrates a method for forming the n-channel drain extension 89 through an n-type cluster implant 88, while FIG. 4b shows the formation of the p-channel drain extension 90 by a p-type cluster implant 91. It is to be noted that both N- and P-types of transistors requires shallow junctions of similar geometries, and thus having both n-type and p-type cluster implants is advantageous for the formation of advanced CMOS structures.

Figure 5:
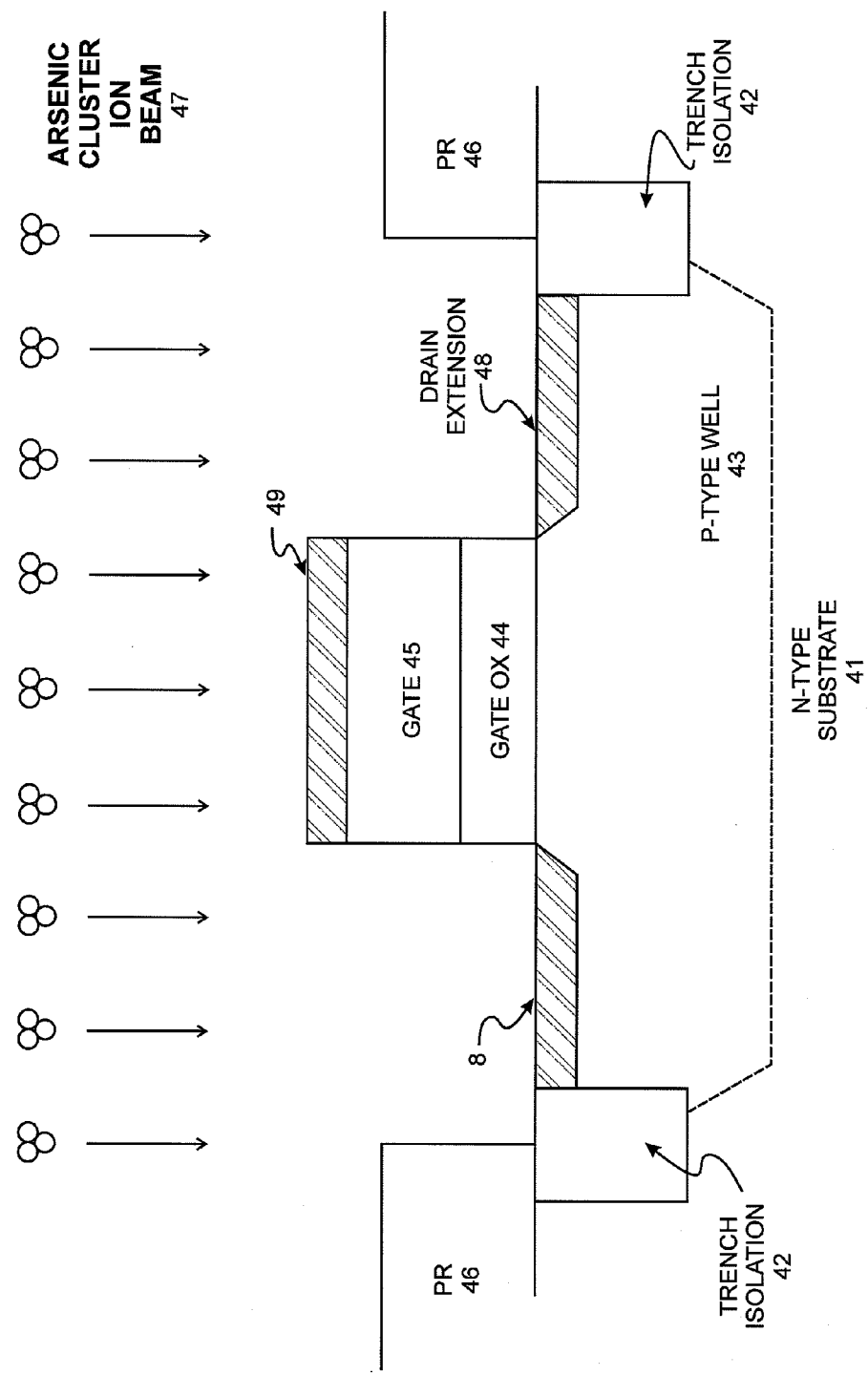
FIG. 5 is a diagram of a semiconductor substrate in the process of manufacturing an NMOS semiconductor device, at the step of n-type drain extension implant.

An example of the application of this method is shown in FIG. 5 for the case of forming an NMOS transistor. This figure shows semiconductor substrate 41 which has undergone some of the front-end process steps of manufacturing a semiconductor device. The structure consists of a N-type semiconductor substrate 41 that has been processed through the p-well 43, trench isolation 42, and gate stack formation 44, 45 steps. The p-well 43 forms a junction with the n-type substrate 41 that provides junction isolation for the transistors in the well. The trench isolation 42 provides lateral dielectric isolation between the N- and P-wells (i.e., in the overall CMOS structure). The gate stack is then constructed, containing the gate oxide layer 44 and the polysilicon gate electrode 45, which have been patterned to form the transistor gate stack. Also, photoresist 46 has been applied and patterned such that the area for NMOS transistors is open, but other areas of the substrate are shielded by the photoresist layer 46. At this point in the process flow, the substrate is ready for the drain extension implant, which is the shallowest doping layer required by the device fabrication process. A typical process requirement for leading-edge devices of the 0.13 μm technology node is an arsenic implant energy of between 1 keV and 2 keV, and an arsenic dose of $5\times10^{14}$ cm$^{-2}$. The cluster ion beam 47, As$_4$H$_x^+$ in this case, is directed at the semiconductor substrate, typically such that the direction of propagation of the ion beam is normal to the substrate, to avoid shadowing by the gate stack. The energy of the As$_4$H$_x^+$ cluster should be four times the desired As$^+$ implant energy, e.g., between 4 keV and 8 keV. The clusters dissociate upon impact with the substrate, and the dopant atoms come to rest in a shallow layer near the surface of the semiconductor substrate, which forms the drain extension region 48. We note that the same implant enters the surface layer of the gate electrode 49, providing additional doping for the gate electrode. The process described in FIG. 5 is thus one important application of the proposed invention.

Figure 5A:
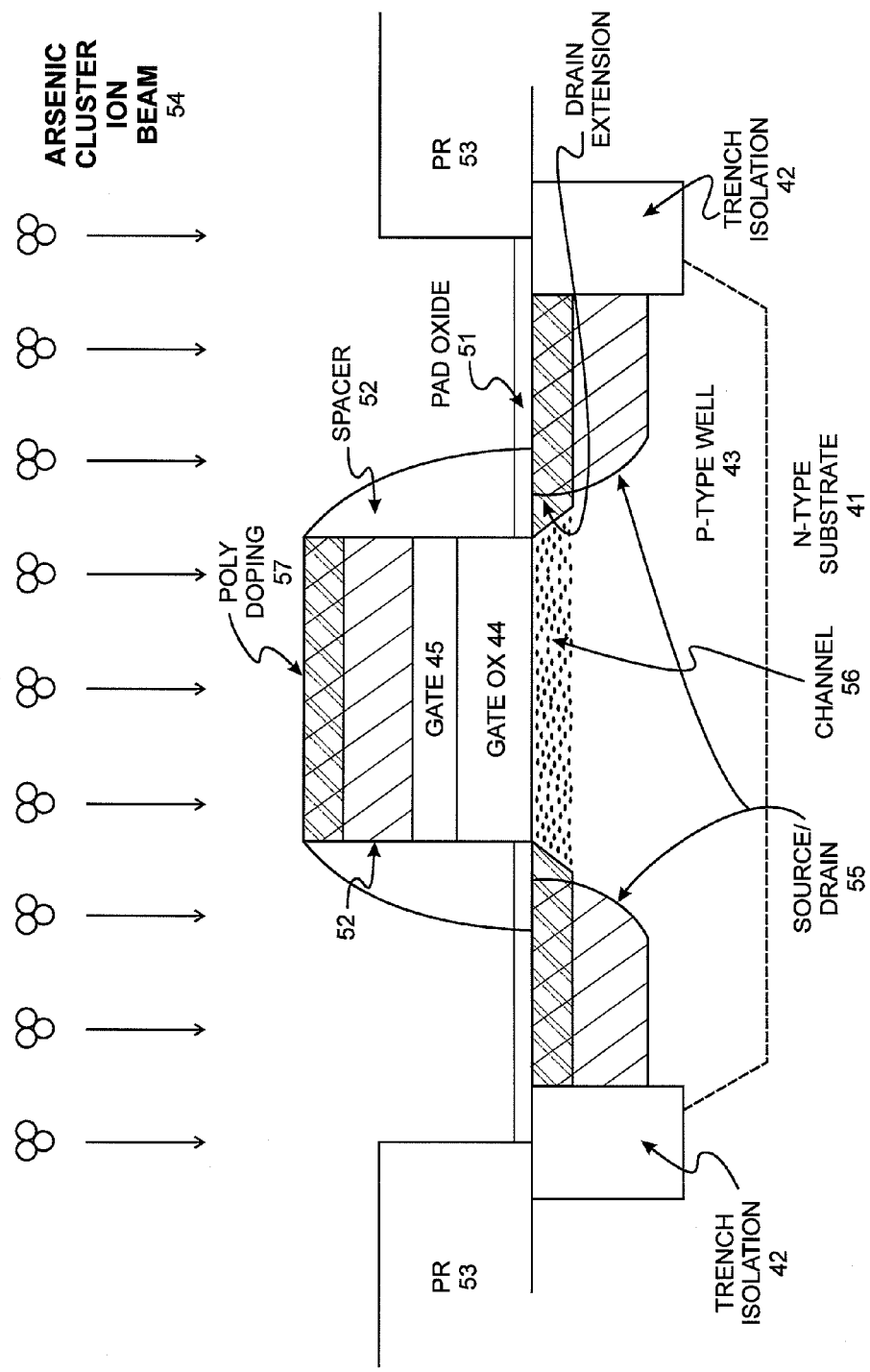
FIG. 5a is a diagram of a semiconductor substrate in the process of manufacturing a NMOS semiconductor device, at the step of the source/drain implant.

A further example of the application of this method is shown in FIG. 5a: the formation of the deep source/drain regions. This figure shows the semiconductor substrate 41 of FIG. 5 after execution of further processes steps in the fabrication of a semiconductor device. The additional process steps include the formation of a pad oxide 51 and the formation of spacers 52 on the sidewalls of the gate stack. At this point, a photoresist layer 53 is applied and patterned to expose the transistor to be implanted, an NMOS transistor in this example. Next, the ion implant to form the source and drain regions 55 is performed. Since this implant requires a high dose at low energy, it is an appropriate application of the proposed cluster implantation method. Typical implant parameters for the 0.13 um technology node are approximately 6 keV per arsenic atom (54) at an arsenic dose of $5\times10^{15}$ cm$^{-2}$, So it requires a 24 keV, $1.25\times10^{15}$ cm$^{-2}$ As$_4$H$_x^+$ implant, a 12 keV, $2.5\times10^{15}$ cm$^{-2}$ As$_2$H$_x^+$ implant, or a 6 keV, $5\times10^{15}$ cm$^{-2}$ As$^+$ implant. As shown in FIG. 5, the source and drain regions 55 are formed by this implant. These regions provide a high conductivity connection between the circuit interconnects (to be formed later in the process) and the intrinsic transistor defined by the drain extension 48 in conjunction with the channel region 56 and the gate stack 44, 45. It may be noted that the gate electrode 45 can be exposed to this implant (as shown), and if so, the source/drain implant provides the primary doping source for the gate electrode. This is shown in FIG. 5a as the poly doping layer 57.

Figure 5B:
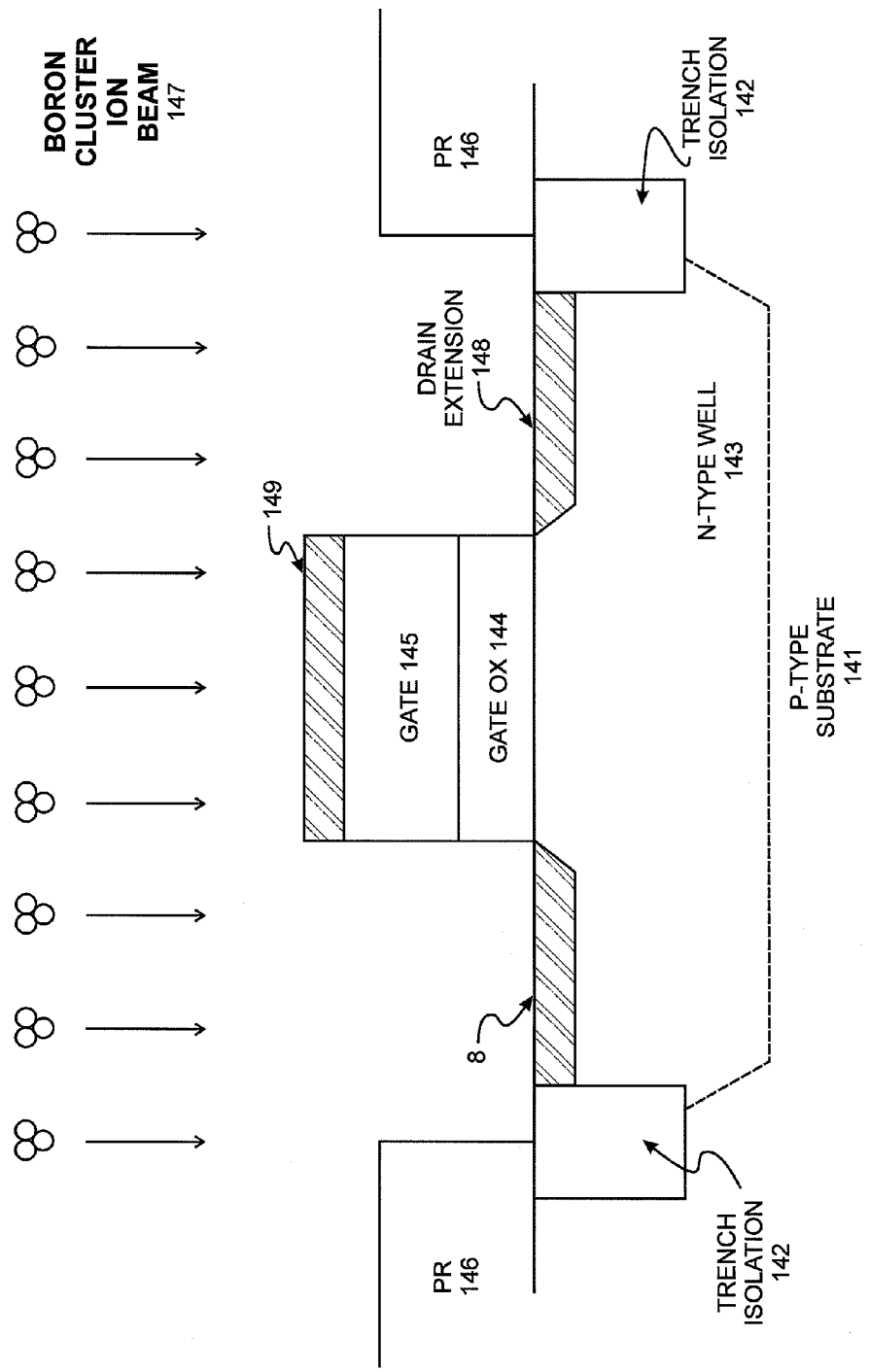
FIG. 5b is a diagram of a semiconductor substrate in the process of manufacturing an PMOS semiconductor device, at the step of n-type drain extension implant.
Figure 5C:
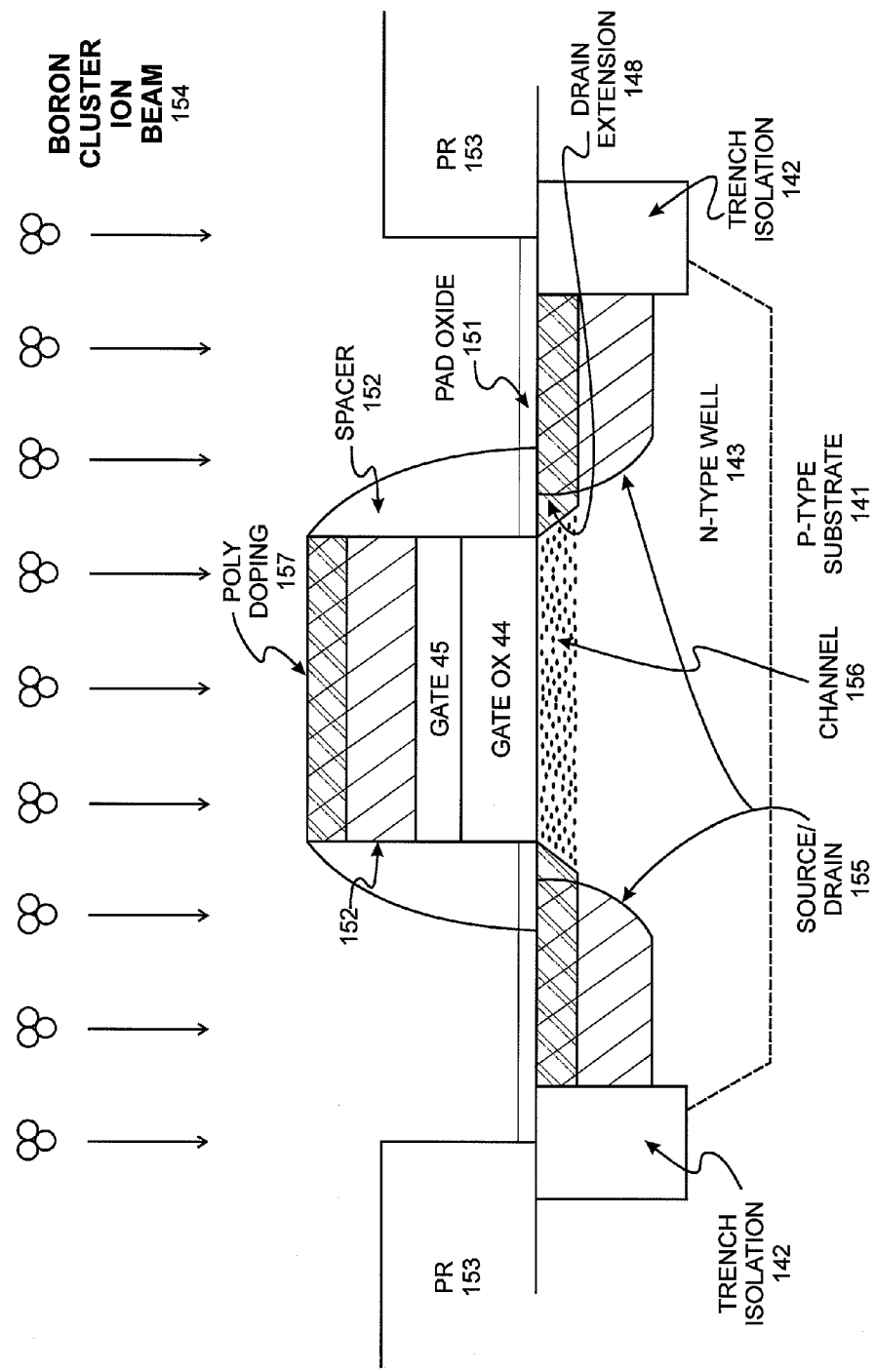
FIG. 5c is a diagram of a semiconductor substrate in the process of manufacturing a PMOS semiconductor device, at the step of the source/drain implant.

The detailed diagrams showing the formation of the PMOS drain extension 148 and PMOS source and drain regions 155 are shown in FIGS. 5b and 5c, respectively. The structures and processes are the same as in FIGS. 5a and 5b with the dopant types reversed. In FIG. 5b, the PMOS drain extension 148 is formed by the implantation of a boron cluster implant 147. Typical parameters for this implant would be an implant energy of 500 eV per boron atom with a dose of $5\times10^{14}$ cm$^{-2}$, for the 0.13 μm technology node. Thus, a B$_{10}$H$_x$ implant would be at 5 keV and a decaborane dose of $5\times10^{13}$ cm$^{-2}$. FIG. 5c shows the formation of the PMOS source and drain regions 148, again by the implantation of a p-type cluster ion beam 154 such as decaborane. Typical parameters for this implant would be an energy of around 2 keV per boron atom with a boron dose of $5\times10^{15}$ cm$^{-2}$ (i.e., 20 keV decaborane at $5\times10^{14}$ cm$^{-2}$) for the 0.13 μm technology node.

In general, ion implantation alone is not sufficient for the formation of an effective semiconductor junction: a heat treatment is necessary to electrically activate the implanted dopants. After implantation, the semiconductor substrate's crystal structure is heavily damaged (substrate atoms are moved out of crystal lattice positions), and the implanted dopants are only weakly bound to the substrate atoms, so that the implanted layer has poor electrical properties. A heat treatment, or anneal, at high temperature (greater than 900 C) is typically performed to repair the semiconductor crystal structure, and to position the dopant atoms substitutionally, i.e., in the position of one of the substrate atoms in the crystal structure. This substitution allows the dopant to bond with the substrate atoms and become electrically active; that is, to change the conductivity of the semiconductor layer. This heat treatment works against the formation of shallow junctions, however, because diffusion of the implanted dopant occurs during the heat treatment. Boron diffusion during heat treatment, in fact, is the limiting factor in achieving USJ's in the sub-0.1 micron regime. Advanced processes have been developed for this heat treatment to minimize the diffusion of the shallow implanted dopants, such as the "spike anneal". The spike anneal is a rapid thermal process wherein the residence time at the highest temperature approaches zero: the temperature ramps up and down as fast as possible. In this way, the high temperatures necessary to activate the implanted dopant are reached while the diffusion of the implanted dopants is minimized. It is anticipated that such advanced heat treatments would be utilized in conjunction with the present invention to maximize its benefits in the fabrication of the completed semiconductor device.

Figure 6:
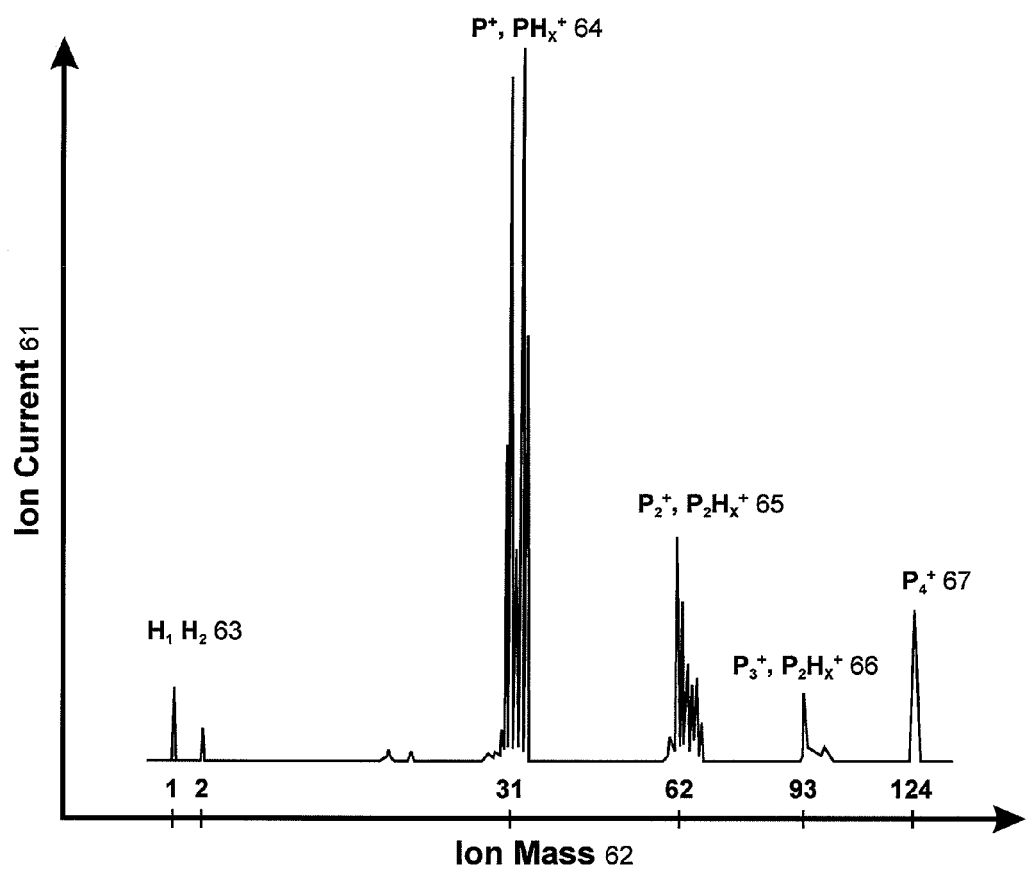
FIG. 6 is a graphical diagram of a mass spectrum of PH$_3$ generated with the ion source of the present invention.

FIG. 6 demonstrates the creation of phosphorus cluster ions and the formation of mass-resolved phosphorus cluster ion beams. This mass spectrum shows data taken during of operation of the ion source of the present invention, using phosphine (PH$_3$) as the source feed gas. This mass spectrum shows the intensity of ion current on the vertical scale 61 versus analyzer magnetic field, which determines ion mass-to-charge ratio, on horizontal scale 62. Currents were measured in a Faraday cup in which secondary electrons were effectively suppressed. Horizontal scale 62, being linear with magnetic field, is nonlinear in mass-to-charge ratio, since for a given extraction voltage V the two quantities are related by m/q=aB$^2$, where a is a constant. This makes higher mass peaks closer together on horizontal scale 62. The phosphorus clusters are observed as the signals 65, 66 and 67 having two, three and four phosphorus atoms per cluster, respectively. Analysis of this spectrum demonstrates that the ion source of the present invention supports the formation and preservation of clusters during operation. The first grouping of signals 63, on the left of the graph, are the hydrogen ions, with mass numbers 1 and 2. The hydrogen peaks are relatively small, much smaller than the phosphorus-containing peaks. The second grouping of signals 64 occurs between masses 31 and 35 and correspond to ions containing one phosphorus atom. During a conventional implantation process, one, several, or all of these peaks might be implanted, depending upon the choice of mass-resolving aperture 27 (see FIG. 2) selected. Some applications might require selection of only the $^{31}$P$^+$ peak, if there is sensitivity to H in the process. In this case, a narrow mass-resolving aperture can be implemented to exclude the hydride peaks, i.e., PH$_x^+$, where x=1, 2, 3, or 4. Other processes may require the implantation of all of the peaks within this group to increase productivity. The next group of signals to the right 65 consist of the phosphorus dimer P$_2$; each of these particles contains two phosphorus atoms. The leftmost significant signal corresponds to P$_2^+$ with mass number 62. The neighboring signals to the right are those for P$_2$H$_x^+$, where x is between one and six. We also note that the intensity of these signals is reduced in comparison to the monomer peaks 64, but the observed intensity depends upon the entire set of source input settings and can be optimized for a desired beam condition, for example to maximize the relative height of the P$_2^+$ peak if dimers are desired. The selection of mass-resolving aperture determines how many of these beams would be implanted during an implantation process. The next signal grouping to the right 66 corresponds to the phosphorus cluster ions containing three phosphorus atoms ($P_3^+$). The next signal to the right 67 corresponds to the phosphorus cluster ions containing four phosphorus atoms. It is interesting to note that the intensity of this cluster is higher than for the $P_3H_x^+$ cluster, and that the net dose rate using the $P_4^+$ cluster (4× the observed intensity) exceeds that for implanting either $P^+$ or $P_2^+$, and that the energy per phosphorus atom implanted is only ¼ of the nominal ion beam energy.

Figure 7:
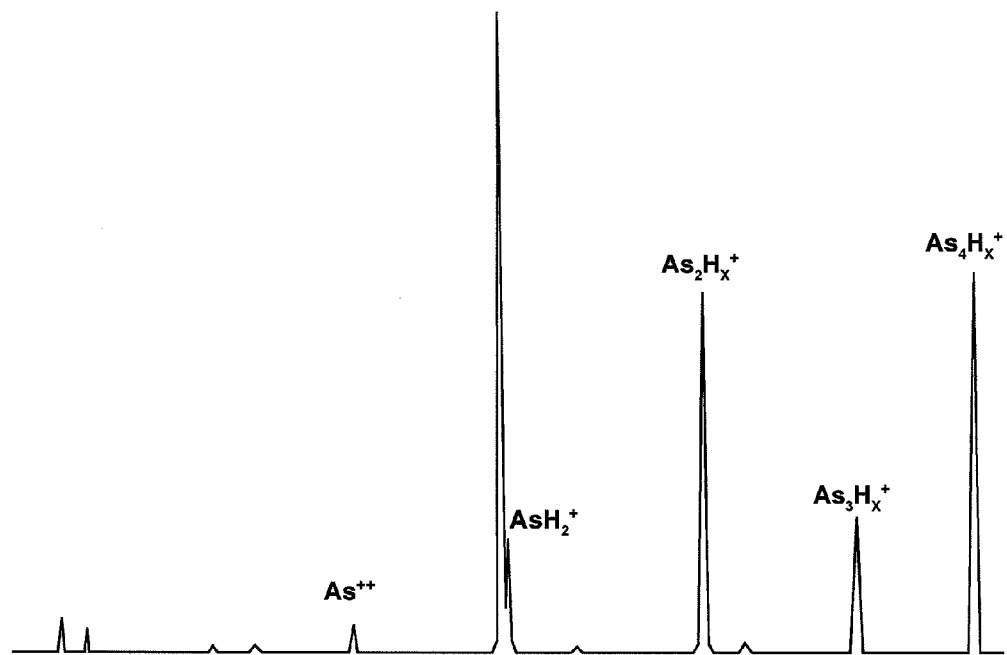
FIG. 7 is a graphical diagram of a mass spectrum of AsH$_3$ generated with the ion source of the present invention.

FIG. 7 shows a mass spectrum of $AsH_3$ using the present invention. The ion beam energy was 19 keV, so that the effective As implant energy of $As_4H_x^+$ would be 4.75 keV. The beam current of $As_4H_x^+$ in FIG. 7 was about 0.25 mA, so that the equivalent As dopant current is about 1 mA. FIG. 7 also illustrates that particle currents between 0.5 mA and 1.0 mA would result from implantation of As, $As_2$, $As_3$, or $As_4$-containing ion beams, also giving an effective implant energy range of between about 20 and 5 keV, by simply adjusting the analyzer magnet current to select different parts of the spectrum of FIG. 7.

Figure 8:
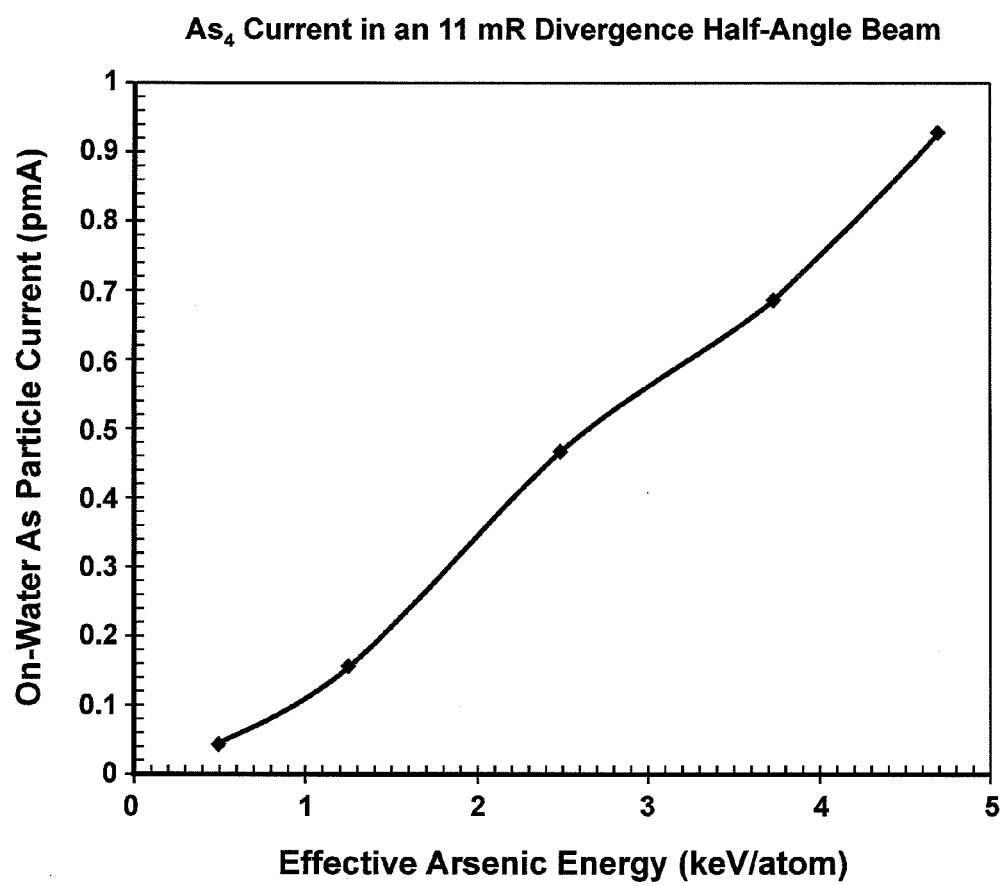
FIG. 8 is a graphical illustration demonstrating On-wafer As$_4$H$_x^+$ ion currents in the low energy range.

FIG. 8 shows $As_4H_x^+$ current as a function of As implant energy. The angular divergence of the ion beam was limited by apertures between the mass resolving aperture (e.g., see 27 of FIG. 3) and Faraday cup to a half-angle in the lateral or dispersive direction of 11 mR, or about 0.6 deg. 1 keV/atom is a lower limit of what semiconductor process will require for arsenic implantation into USJ devices.

Figure 9:
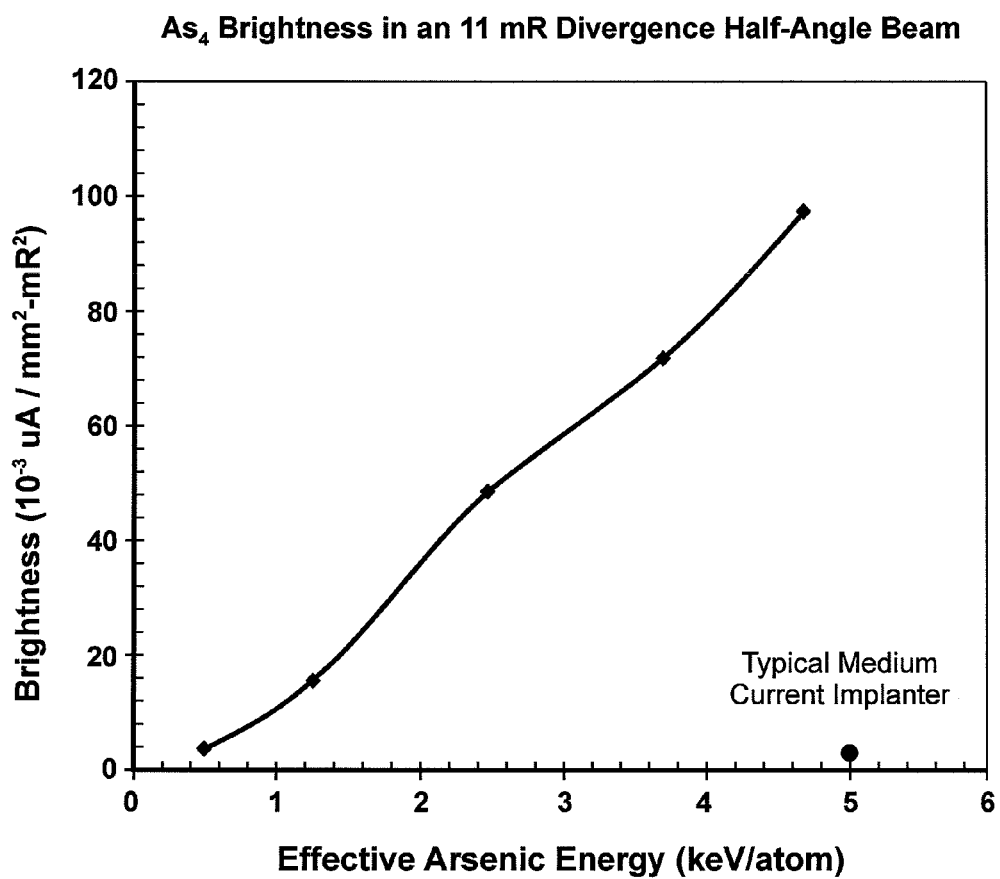
FIG. 9 is a graphical illustration of the data illustrated in FIG. 6 converted to units of beam brightness.

FIG. 9 illustrates the beam currents of FIG. 8 converted to units of beam brightness, and comparison to a "typical" modern-day medium-current implanter. The improvement is about a factor of 30 (the medium-current implanter specifications we assumed were: 40 mrad half-angular acceptance, and 200 uA of beam current at 10 keV). Stephens, in *Handbook of Ion Implantation Technology*, J. F. Ziegler, ed., North-Holland, pp. 455-499 (1992), define brightness B at as:

$$B = 2I/\pi^2 \epsilon^2 \, (\mu A \cdot mm^{-2} \cdot mrad^{-2}), \quad (6)$$

where I is the effective dopant beam current in microamperes, and $\epsilon$ is the beam emittance in square (milliradians-millimeters). Emittance is calculated by $$\epsilon = \delta \alpha, \quad (7)$$

where $\delta$ is the beam half-width in the dispersive plane, and $\alpha$ is the half-pencil angle, both measured at the image plane, i.e., at the resolving aperture location.

Beam brightness is an important figure of merit which quantifies how much beam current can be transmitted into a certain acceptance, for example through a tube of a certain diameter and length. Since ion implanter beam lines have well-defined acceptances, brightness is an important measure of productivity for emittance-limited beams. Emittance is usually the limiting factor in the transport of low-energy beams. We note that this is largely the benefit of using cluster ions versus monomer ions, as expressed in Equation (1)-(3). For $As_4$ implantation, Eq. (3) predicts a throughput increase of sixteen, i.e., $\Delta = n^2$.

Figure 10:
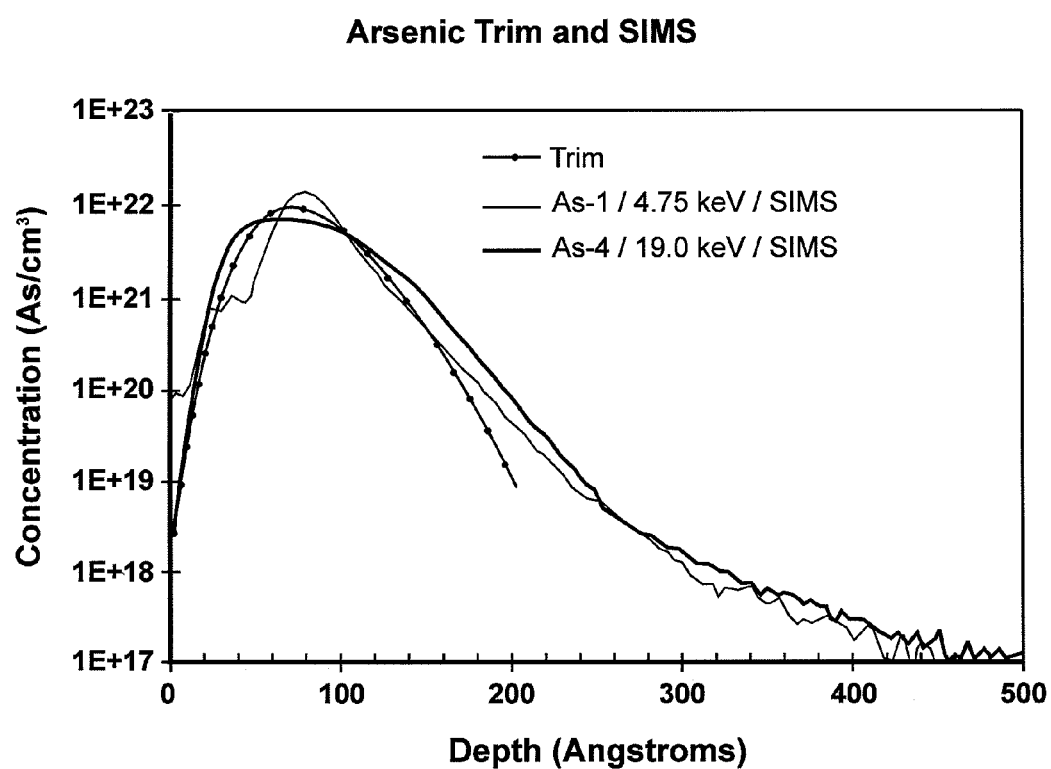
FIG. 10 is a graphical illustration of as-implanted SIMS profiles of arsenic concentrations from AsH$_x^+$ and As$_4$H$_x^+$ ion beams implanted into silicon wafers using the present invention, and comparison with TRIM calculations.

FIG. 10 shows Secondary Ion Mass Spectroscopy (SIMS) results for silicon samples implanted with $AsH_x^+$ and $As_4H_x^+$ ions at 4.75 keV and 19 keV, respectively. Atomic doses were approximately $1 \times 10^{16}$ cm$^{-2}$. These data are compared with a full dynamical scattering model, TRIM, which is commonly used in the industry to simulate ion implantation into silicon. The results indicate that we are indeed implanting As and $As_4$ at the designated energies.

Figure 11:
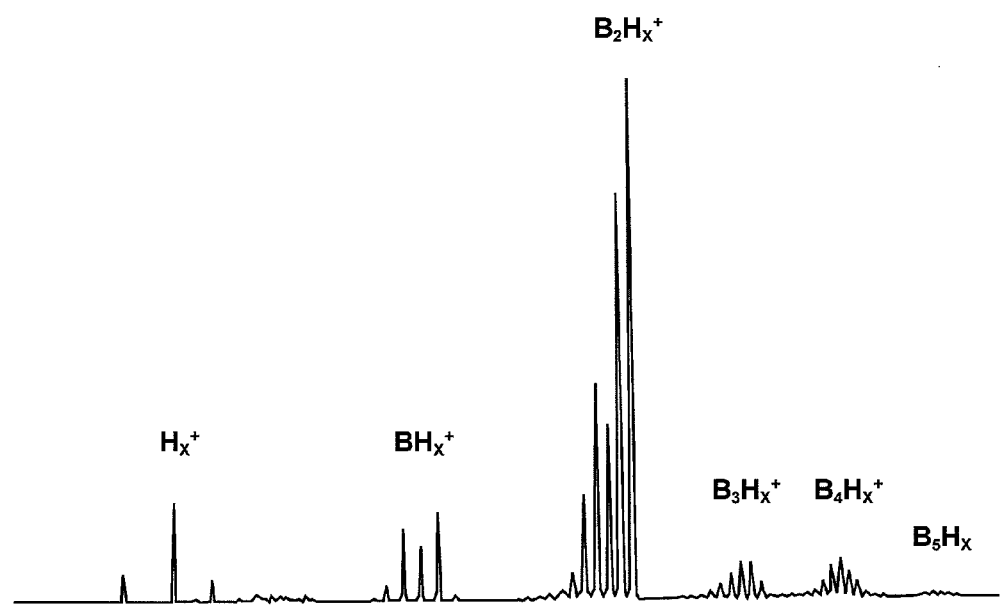
FIG. 11 is a graphical illustration of a mass spectrum of B$_2$H$_6$ generated with the ion source of the present invention.

FIG. 11 shows a mass spectrum of diborane, $B_2H_6$, a gaseous material not commonly used in conventional ion implantation, but commercially available. FIG. 11 shows groupings of H ($H^+$, $H_2^+$, $H_3^+$), B (B, $BH^+$, $BH_2^+$), $B_2$ ($B_2^+$, $B_2H^+$, $B_2H_2+$, $B_2H_3^+$, $B_2H_4^+$, $B_3$ ($B_3$, $B_3H^+$, $B_3H_2^+$, $B_3H_3^+$, $B_3H_4^+$), $B_4$ (B4, $B_4H^+$, $B_4H_2^+$, $B_4H_3^+$, $B_4H_4^+$), and a $B_5$ group. The spectrum of FIG. 11 is somewhat complicated in it's interpretation because there are two naturally-occuring isotopes of boron present, $^{10}B$ and $^{11}B$, which are represented in about a 4:1 ratio of $^{11}B$ to $^{10}B$, reflecting their natural abundances. For example, both $^{11}B$ and $^{10}BH$ are present in the peak at 11 amu.

Figure 12:
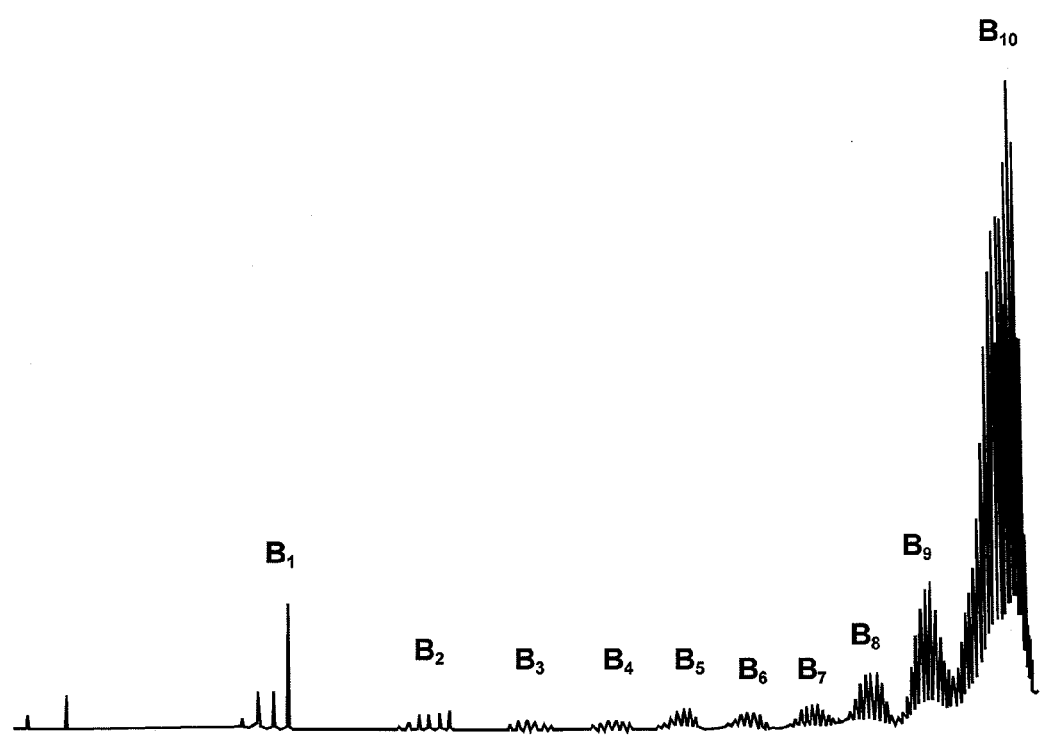
FIG. 12 is a graphical illustration of recorded positive-ion mass spectrum for the present invention operating with decaborane feed material.

FIG. 12 demonstrates the creation of boron hydride clusters and positive cluster ions in the present invention. This mass spectrum shows data taken during of operation of the ion source of the present invention, using vaporized decaborane $B_{10}H_{14}$ as the source feed material. Boron hydride clusters of the form $B_yH_x^+$ with $1 \leq y \leq 10$ and $0 \leq x \leq 14$ are shown, separated by 1 amu from 1 amu to about 124 amu. The largest signal observed, $B_{10}H_x^+$, corresponds to decaborane molecular ions, which are formed by direct ionization of the decaborane parent molecule.

Figure 13:
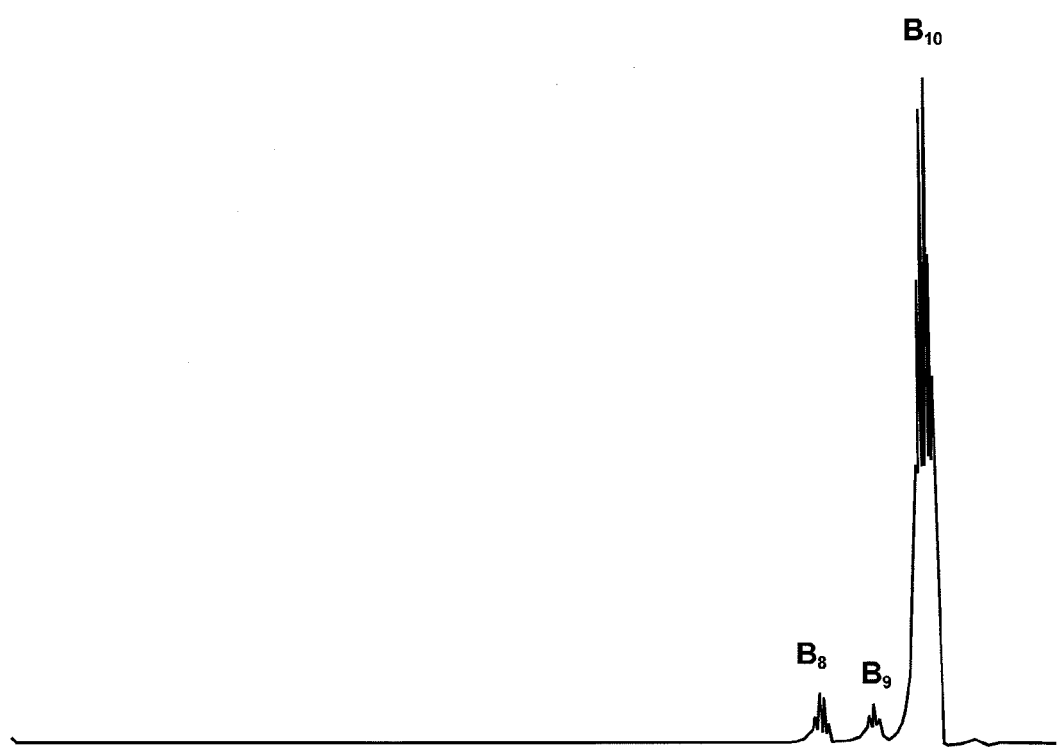
FIG. 13 is a graphical illustration of recorded negative-ion mass spectrum for the present invention operating with decaborane feed material.
Figure 14:
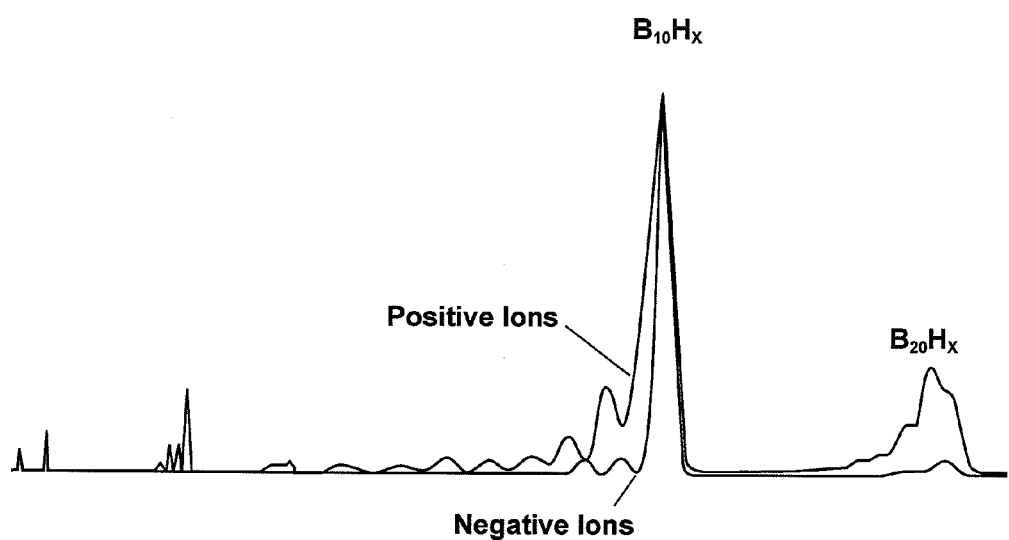
FIG. 14 is a graphical illustration of recorded mass spectrum of both negative-ion and positive-ion decaborane taken in succession, also showing the dimer, B$_{20}$H$_x$.

FIG. 13 shows a negative ion spectrum of decaborane produced by the ion source of the present invention, analogous to the spectrum of FIG. 12. Far fewer ion states are formed by negative decaborane ions, so the majority (about 90%) of the ions are contained within the parent $B_{10}H_x^-$ peak. The use of negative ions for ion implantation of semiconductors is very beneficial since it virtually eliminates the wafer charging observed with positive ion implantation. It is unusual for an ion source to produce abundant quantities of both positive and negative ions of a given material; the peak ion currents of FIGS. 12 and 13 are the same within a factor of two. This is shown dramatically in FIG. 14 for an extended mass range. These data were collected as shown by collecting a positive-ion mass spectrum, reversing the polarities of the ion implanter power supplies, and collecting a negative ion spectrum over the same mass range on the same sheet of paper, with the ion implantation system of the present invention. The Faraday cup currents were fed to an x-y paper recorder in order to collect FIG. 14. Significant advantages are evident in implanting negative ions rather than positive ions in the case of decaborane: 1) more useful ion current is within the peak of interest, resulting in greater useful dopant flux; 2) the parent peak is narrower in mass by almost a factor of two (a full width at half-maximum of five amu for the negative ions versus nine amu for the positive ions), and 3) the elimination of wafer charging, as is generally accepted in the art, when negative ions are substituted for positive ions.

Figure 15:
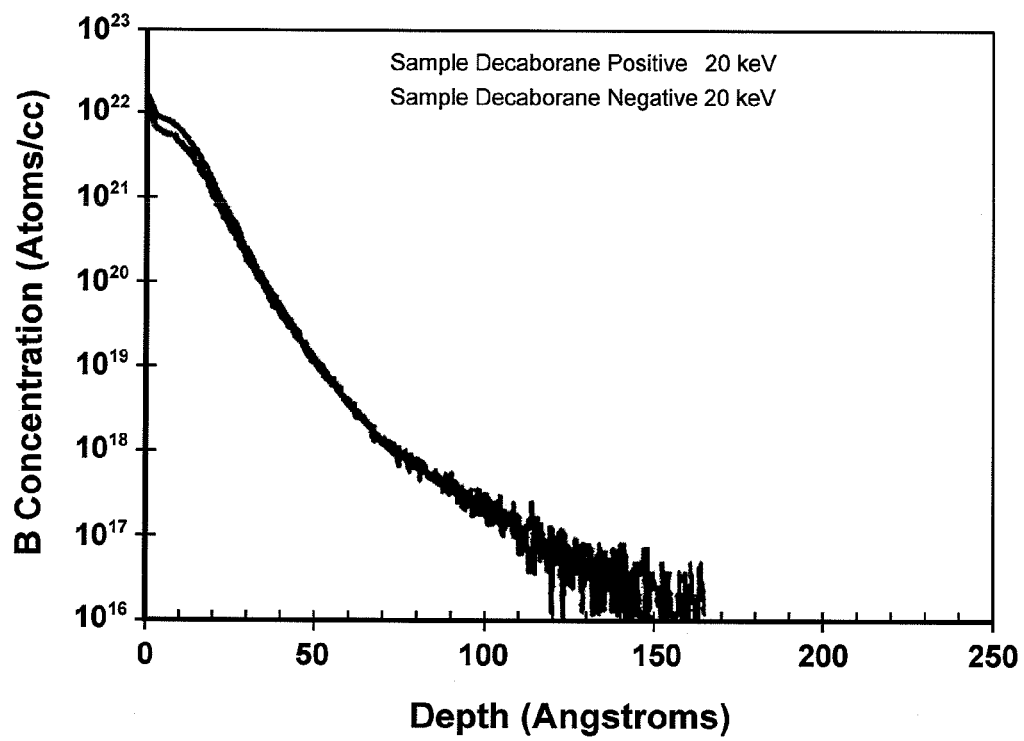
FIG. 15 is a graphical illustration of as-implanted SIMS profiles of negative and positive B$_{10}$H$_x$ ions using the present invention, at a decaborane implantation energy of 20 keV.

FIG. 15 shows SIMS profiles for both positive and negative decaborane ions implanted into silicon samples at a decaborane energy of 20 keV. The profiles are nearly identical, as one would expect if each ion possessed the same number of boron atoms, and thus are implanted to the same projected range.

Figure 16:
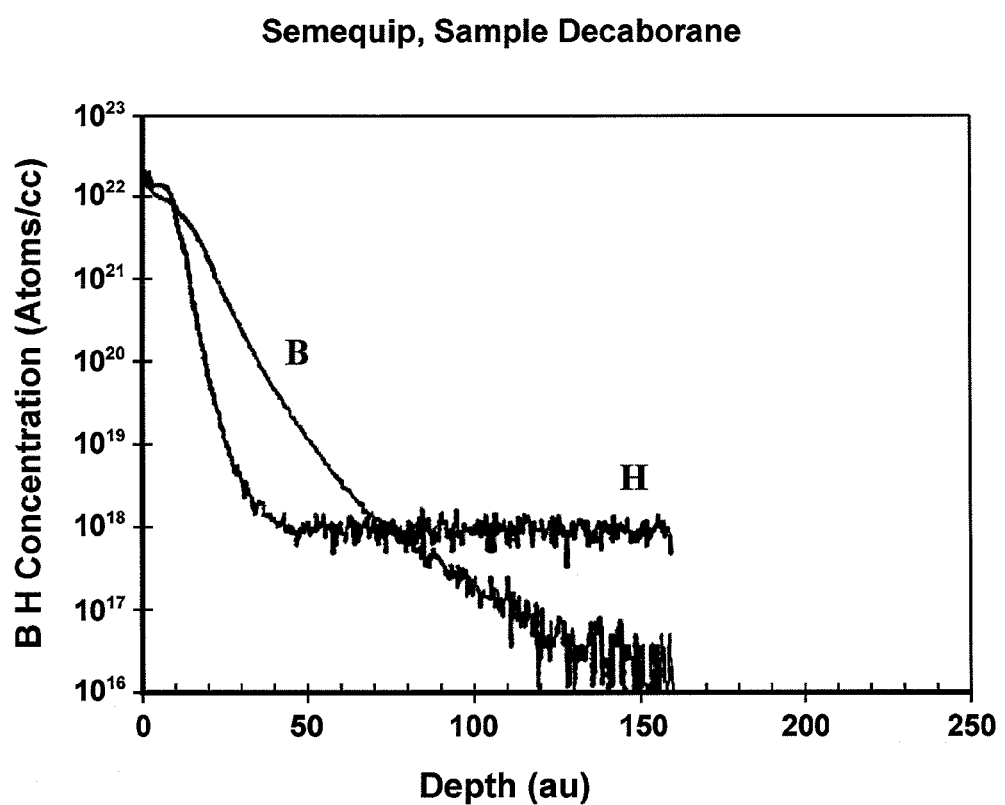
FIG. 16 is a graphical illustration of as-implanted SIMS profiles of 20 keV decaborane implanted into silicon, showing B concentration and H concentration.

FIG. 16 shows SIMS data for a negative decaborane implant, showing also H concentration. The H dose was 0.9 times the boron dose, which suggests an average chemical formula for negative decaborane of $B_{10}H_9^-$.

There are several elements of interest for use in the formation of shallow junctions in semiconductors. For silicon applications, the primary dopants are boron, phosphorus, arsenic and antimony, so these elements have the largest potential application to the formation of shallow junctions. Further, silicon and germanium implants are used to form amorphous regions in silicon, so clusters of these elements would be useful for the formation of shallow amorphous regions. For compound semiconductors, elements of interest for shallow junctions include silicon, germanium, tin, zinc, cadmium and beryllium, so clusters of these elements have opportunity in the formation of shallow junctions in compound semiconductor manufacturing.

One aspect of this method is providing the proper environment within the ionization chamber for the formation of cluster ions. Each of the various elements discussed has different chemical properties and so the optimal environment is different for each element. Each element and each selected cluster will require a different set of the input parameters to achieve optimal performance. The parameters available for optimization include: the source pressure as controlled by the flow of feed material, the temperature inside the ionization chamber as controlled by the temperature control system, the ionization energy intensity and characteristics, such as the electron beam current and electron energy when the ionization energy is an electron beam. These basic parameters work together to create the appropriate environment within the source ionization chamber for the formation and ionization of the dopant clusters.

As has been described above, the ion implantation of clusters of dopant atoms makes it possible to implant both n-type and p-type dopants at a shallow depth with high efficiency, as compared to the ion implantation of single dopant atoms.

The present invention has been described, along with several embodiments. The present invention is not limited thereto. For example, it will be apparent to those skilled in the art that various modifications, alterations, improvements and combination thereof are possible.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A method of implanting dopant cluster ions into a semiconductor substrate comprising the steps of:
   (a) making N-type cluster ions by way of electron impact of an electron beam of with arsine gas molecules;
   (b) making P-type cluster ions by way of electron impact of an electron beam of with P-type gas molecules; and
   (c) implanting said N-type cluster ions into a first region of said substrate; and
   (d) implanting said P-type cluster ions into a second region of said substrate.

2. The method as recited in claim 1, wherein step (a) comprises making said N-type cluster ions from a source of arsine gas ($AsH_3$) gas.

3. The method as recited in claim 1, wherein step (a) includes providing a conduit between said source of arsine ($AsH_3$) gas and an ionization chamber to enable said gaseous arsine ($AsH_3$) to communicate with said ionization chamber; and ionizing said arsine ($AsH_3$) gas in said ionization chamber by way of direct electron impact ionization.

4. The method as recited in claim 3, further including the step of controlling the temperature of said ionization chamber to a predetermined value.

5. The method as recited in claim 3, wherein said implanting step includes the step of extracting $As_4^+$ ions from said ionization chamber by an electric field.

6. The method as cited in claim 5, further including the step of mass analyzing the extracted ions by selecting the $As_4^+$ ions.

7. The method as recited in claim 1 wherein said step (b) comprises making negative decaborane cluster ions ($B_{10}H_x^-$), where x is an integer and $0 \leq x \leq 14$ by direct electron impact.

8. The method as recited in claim 1, wherein step (b) comprises making $As_4H_x^+$ cluster ions, where x is an integer and $1 \leq x \leq 6$.

9. The method as recited in claim 8, wherein step (b) includes providing a conduit between said source of arsine ($AsH_3$) gas and an ionization chamber to enable said gaseous arsine ($AsH_3$) to communicate with said ionization chamber; and ionizing said arsine ($AsH_3$) gas in said ionization chamber by direct electron impact.

10. The method as recited in claim 9, further including the step of controlling the temperature of said ionization chamber to a predetermined value.

11. The method as recited in claim 9, wherein said implanting step includes the step of extracting said dopant cluster ions from said ionization chamber by an electric field.

12. The method as cited in claim 11, further including the step of mass analyzing the extracted ions by selecting said dopant cluster ions.

13. The method as recited in claim 8, further including the step of:
   making P-type dopant cluster ions; and implanting said P-type dopant cluster ions into said substrate into a second region different than said first region.

14. The method as recited in claim 13, wherein said making step comprises generating negative decaborane cluster ions ($B_{10}H_x^-$), where x is an integer and $0 \leq x \leq 14$.

15. The method as recited in claim 1 wherein step (a) comprises: making N-type dopant cluster ions $As_3Hx+$, where x is an integer and $1 \leq x \leq 5$.

16. The method as recited in claim 15, wherein said making step, includes providing a conduit between said source of arsine ($AsH_3$) gas and an ionization chamber to enable said gaseous arsine ($AsH_3$) to communicate with said ionization chamber; and ionizing said arsine ($AsH_3$) gas in said ionization chamber by electron impact.

17. The method as recited in claim 16, further including the step of controlling the temperature of said ionization chamber to a predetermined value.

18. The method as recited in claim 16, wherein said implanting step includes the step of extracting said dopant cluster ions from said ionization chamber by an electric field.

19. The method as cited in claim 16, further including the step of mass analyzing the extracted ions and selecting the $As_3H_x^+$. species.

20. The method as recited in claim 16, further including the step of: making P-type dopant cluster ions, and implanting said P-type dopant cluster ions into said substrate into a second region different than said first region.

21. The method as recited in claim 20, wherein said making step comprises generating negative decaborane cluster ion ($B_{10}H_x^-$), where x is an integer and $0 \leq x \leq 14$.

22. The method as recited in claim 2, wherein step (a) comprises making $As_4^+$ cluster ions.

23. The method as recited in claim 2, wherein step (a) comprises making $As_3^+$ cluster ions.

24. The method as recited in claim 2, wherein step (a) comprises: making $As_2^+$ cluster ions.

25. The method as recited in claim 2, wherein step (a) comprises making $As_4H_x^+$ cluster ions, where x is an integer and $1 \leq x \leq 6$.

26. The method as recited in claim 2, wherein step (a) comprises making $As_3H_x^+$ cluster ions, where x is an integer and $1 \leq x \leq 5$.

27. The method as recited in claim 2, wherein step (a) comprises making $As_2H_x^+$ cluster ions, where x is an integer and $1 \leq x \leq 4$.

28. The method as recited in claim 1, wherein step (a) comprises making said N-type cluster ions from elemental arsenic vapor, As.

29. The method as recited in claim 28, wherein step (a) comprises making $As_4^+$ cluster ions.

30. The method as recited in claim 28, wherein step (a) comprises making $As_2^+$ cluster ions.

31. The method as recited in claim 1, wherein step (a) comprises making said N-type cluster ions from phosphine ($PH_3$) gas.

32. The method as recited in claim 31, wherein step (a) comprises making $P_4^+$ cluster ions.

33. The method as recited in claim 31, wherein step (a) comprises making $P_3^+$ cluster ions.

34. The method as recited in claim 31, wherein step (a) comprises making $P_2^+$ cluster ions.

35. The method as recited in claim 31, wherein step (a) comprises making $P_4H_x^+$ cluster ions, where x is an integer and $1 \leq x \leq 6$.

36. The method as recited in claim 31, wherein step (a) comprises making $P_3H_x^+$ cluster ions, where x is an integer and $1 \leq x \leq 5$.

37. The method as recited in claim 31, wherein step (a) comprises making $P_2H_x^+$ cluster ions, where x is an integer and $1 \leq x \leq 4$.

38. The method as recited in claim 1, wherein step (a) comprises making said N-type cluster ions from elemental phosphorus vapor, P.

39. The method as recited in claim 38, wherein step (a) comprises making $P_4^+$ cluster ions.

40. The method as recited in claim 38, wherein step (a) comprises making $P_3^+$ cluster ions.

41. The method as recited in claim 38, wherein step (a) comprises making $P_2^+$ cluster ions.

42. A method of implanting dopant cluster ions into a semiconductor substrate comprising the steps of:
 (a) making N-type cluster ions by way of electron impact of an electron beam of with phosphine gas molecules;
 (b) making P-type cluster ions by way of electron impact of an electron beam of with P-type gas molecules; and
 (c) implanting said N-type cluster ions into a first region of said substrate; and
 (d) implanting said P-type cluster ions into a second region of said substrate.

* * * * *

UNITED STATES PATENT AND TRADEMARK OFFICE
CERTIFICATE OF CORRECTION

PATENT NO.         : 7,994,031 B2                                       Page 1 of 1
APPLICATION NO.    : 11/647922
DATED              : August 9, 2011
INVENTOR(S)        : Thomas N. Horsky et al.

It is certified that error appears in the above-identified patent and that said Letters Patent is hereby corrected as shown below:

Claim 1, Column 17, line 39, please remove the word --of-- between "beam" and "with"

Claim 1, Column 17, line 41, please remove the word --of-- between "beam" and "with"

Claim 42, Column 20, line 16, please remove the word --of-- between "beam" and "with"

Claim 42, Column 20, line 18, please remove the word --of-- between "beam" and "with"

Signed and Sealed this
Twenty-fifth Day of October, 2011

David J. Kappos
*Director of the United States Patent and Trademark Office*